(12) United States Patent
Ikenaga et al.

(10) Patent No.: US 9,193,854 B2
(45) Date of Patent: Nov. 24, 2015

(54) ENCAPSULATING MATERIAL FOR SOLAR CELL AND SOLAR CELL MODULE

(71) Applicant: MITSUI CHEMICALS TOHCELLO, INC., Chiyoda-ku (JP)

(72) Inventors: Shigenobu Ikenaga, Chiba (JP); Fumito Takeuchi, Chiba (JP); Tomoaki Ito, Ichihara (JP); Nobuhiro Maruko, Ichihara (JP); Masaaki Odoi, Hitachinaka (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 0 days.

(21) Appl. No.: 14/370,716

(22) PCT Filed: Dec. 26, 2012

(86) PCT No.: PCT/JP2012/008303
§ 371 (c)(1),
(2) Date: Jul. 3, 2014

(87) PCT Pub. No.: WO2013/102984
PCT Pub. Date: Jul. 11, 2013

(65) Prior Publication Data
US 2015/0000739 A1  Jan. 1, 2015

(30) Foreign Application Priority Data
Jan. 5, 2012 (JP) ................. 2012-000809

(51) Int. Cl.
| | |
|---|---|
| B60C 1/00 | (2006.01) |
| C08F 118/02 | (2006.01) |
| C08F 210/00 | (2006.01) |
| H02N 6/00 | (2006.01) |
| C08L 23/08 | (2006.01) |
| C08L 23/02 | (2006.01) |
| H01L 31/048 | (2014.01) |
| C08L 33/06 | (2006.01) |

(52) U.S. Cl.
CPC ............ C08L 23/0815 (2013.01); C08L 23/02 (2013.01); C08L 33/06 (2013.01);
(Continued)

(58) Field of Classification Search
CPC . H01L 31/0481; C08L 23/02; C08L 23/0815; C08L 2205/02; C08L 2203/204; C08L 2203/206; Y02E 10/50
USPC ................. 524/570; 526/319, 348; 136/251
See application file for complete search history.

(56) References Cited

U.S. PATENT DOCUMENTS

| | | | |
|---|---|---|---|
| 8,772,625 B2 * | 7/2014 | Ikenaga et al. ............... 136/251 |
| 2009/0023867 A1 * | 1/2009 | Nishijima et al. ............ 525/387 |
| 2009/0165847 A1 | 7/2009 | Mori et al. | |

FOREIGN PATENT DOCUMENTS

| | | |
|---|---|---|
| CN | 101115787 A | 1/2008 |
| CN | 101313046 A | 11/2008 |

(Continued)

OTHER PUBLICATIONS

International Search Report (PCT/ISA/210) mailed on Feb. 19, 2013, by the Japanese Patent Office as the International Searching Authority for International Application No. PCT/JP2012/008303.
(Continued)

*Primary Examiner* — William Cheung
(74) *Attorney, Agent, or Firm* — Buchanan, Ingersoll & Rooney PC

(57) ABSTRACT

An encapsulating material for solar cell is made of a resin composition containing a crosslinkable resin, and satisfies the following 1) and 2). 1) When the encapsulating material for solar cell is immersed in acetone at 23° C. for one hour after a crosslinking treatment in which the encapsulating material for solar cell is heated and depressurized at 150° C. and 250 Pa for three minutes, and then is heated and pressurized at 150° C. and 100 kPa for 15 minutes, an acetone-absorbing ratio is in a range of 3.5 weight % to 12.0 weight % with respect to the weight of the above-described crosslinking-treated encapsulating material for solar cell. 2) A volume resistivity of the above-described crosslinking-treated encapsulating material for solar cell, which is based on JIS K6911 and measured at a temperature of 100° C. with an applied voltage of 500 V, is in a range of $1.0\times10^{13}$ Ω·cm to $1.0\times10^{18}$ Ω·cm.

21 Claims, 2 Drawing Sheets

(52) U.S. Cl.
CPC ...... *H01L 31/0481* (2013.01); *C08L 2203/204* (2013.01); *C08L 2203/206* (2013.01); *C08L 2205/02* (2013.01); *Y02E 10/50* (2013.01)

(56) References Cited

FOREIGN PATENT DOCUMENTS

| | | |
|---|---|---|
| JP | 2008-153520 A | 7/2008 |
| JP | 2010-059259 A | 3/2010 |
| JP | 2011-012243 A | 1/2011 |
| JP | 2011-153286 A | 8/2011 |
| JP | 2011-204970 A | 10/2011 |

OTHER PUBLICATIONS

Office Action issued by the Chinese Patent Office in corresponding Chinese Patent Application No. 201280065927.2 on Aug. 28, 2015 (9 pages).

\* cited by examiner

ENCAPSULATING MATERIAL FOR SOLAR CELL AND SOLAR CELL MODULE

This application is a U.S. national stage application of International Application No. PCT/JP2012/008303 filed Dec. 26, 2012, which claims priority to Japan Patent Application Number 2012-000809 filed Jan. 5, 2012, the contents of which are hereby incorporated by reference in their entirety.

TECHNICAL FIELD

The present invention relates to an encapsulating material for solar cell and a solar cell module.

BACKGROUND ART

In response to the increasing seriousness of global environmental issues, energy issues, and the like, a solar cell is attracting attention as clean energy-generating means with no concern over depletion. In a case in which a solar cell is used outdoors such as on the roof of a building, it is usual to use the solar cell in a solar cell module form.

Generally, the solar cell module is manufactured in the following order. First, a crystalline solar cell element (hereinafter also referred to as a power generation element or a cell in some cases) formed of polycrystalline silicon or monocrystalline silicon, or a thin film-type solar cell element obtained by forming an extremely thin (several micrometers) film of amorphous silicon or crystal silicon on a glass substrate or the like is manufactured. Next, to obtain a crystalline solar cell module, a protective sheet (a transparent surface protective member) for the solar cell module, an encapsulating material for solar cell, the crystalline solar cell element, an encapsulating material for solar cell, and a protective sheet (a back surface protective member) for the solar cell module are sequentially laminated. Meanwhile, to obtain a thin film-based solar cell module, a thin film-type solar cell element, an encapsulating material for solar cell, and a protective sheet (a back surface protective member) for the solar cell module are sequentially laminated. After that, the solar cell module is manufactured using a lamination method or the like in which the above-described laminate is suctioned in a vacuum, heated and pressed. The solar cell module manufactured in the above-described manner is weather resistant and is also suitable for outdoor use such as on the roof of a building.

An ethylene/vinyl acetate copolymer (EVA) film is widely used as an encapsulating material for solar cell due to its excellent transparency, flexibility, adhesiveness, and the like. However, in a case in which an EVA composition was used as a constituent material for an encapsulating material for solar cell, there was a concern over the possibility of a component being generated by the decomposition of EVA such as acetic acid gas affecting a solar cell element. In addition, while satisfying the above-described properties, an ethylene/vinyl acetate copolymer had a high polarity of vinyl acetate in the ethylene/vinyl acetate copolymer and thus had an insufficient volume resistivity.

In contrast to the ethylene/vinyl acetate copolymer film, a sheet of the encapsulating material for solar cell has been proposed which contains an ethylene/vinyl acetate copolymer, an ionomer of an ethylene/unsaturated carboxylic acid copolymer, and an organic peroxide, does not cause the corrosion-induced deterioration of a solar cell element even in a case in which the solar cell element is used for a long period of time in a constant temperature and humidity condition, and does not cause the degradation of the power generation performance of the solar cell element (for example, refer to Patent Document 1).

In addition, a resin composition for an encapsulating material for solar cell has also been proposed which contains an ethylene/α-olefin copolymer, an ethylene functional group-containing monomer copolymer, and an organic peroxide, and has excellent extrusion productivity, transparency, heat resistance, and adhesiveness to glass (for example, refer to Patent Document 2).

RELATED DOCUMENT

Patent Document

[Patent Document 1] Japanese Unexamined Patent Publication No. 2010-59259
[Patent Document 2] Japanese Unexamined Patent Publication No. 2011-153286

DISCLOSURE OF THE INVENTION

In accordance with the recent distribution of solar power generation, the size of a power generation system has been increasing, such as a mega solar power generation system, and also there is a movement of increasing the system voltage to decrease the transmission loss. In a solar cell module, an increase in the system voltage increases the potential difference between a frame and a cell. That is, generally, when the frame of the solar cell module is grounded, and the system voltage of a solar cell array reaches a voltage in a range of 600 V to 1000 V, the potential difference between the frame and the cell serves as the system voltage in a module in which the voltage becomes highest, and daytime power generation is maintained in a state in which a high voltage is applied. In addition, glass has a lower electric resistance compared with an encapsulating material for solar cell, and a high voltage is generated between a transparent surface protective member such as a glass plate and the cell through the frame. That is, in a state of daytime power generation, in modules connected in series, the potential difference between the cell and the module frame and the potential difference between the cell and the surface of a glass plate increase sequentially from the ground side, and the potential difference on the high voltage side of the system voltage is rarely changed in a portion with the largest potential difference. As a solar cell module used in the above-described state, there is a report regarding an example of a module in which a crystalline power generation element is used in which a potential induced degradation (PID) phenomenon in which the output is significantly decreased and the characteristics deteriorate occurs. As a result, there has been a demand for the improvement of a volume resistivity of an encapsulating material for solar cell in direct contact with a solar cell element to solve the above-described problem.

However, according to the present inventors' studies, while the sheet of the encapsulating material for solar cell described in Patent Document 1 contains a great content of the ethylene/vinyl acetate copolymer, and is capable of sufficiently suppressing the generation of air bubbles, the sheet of the encapsulating material for solar cell has an insufficient volume resistivity and is thus incapable of suppressing the PID phenomenon. In addition, the resin composition for an encapsulating material for solar cell described in Patent Document 2 is incapable of sufficiently suppressing the generation of air bubbles in a module, and therefore there is a case in which the encapsulating material for solar cell is peeled off from the solar cell element or cracking occurs in the solar cell element.

The invention has been made in consideration of the above-described problems of the related art, and an object of the invention is to provide an encapsulating material for solar cell capable of suppressing the PID phenomenon and the generation of air bubbles in a module, and a solar cell module in which an encapsulating material for solar cell is used.

As a result of intensive studies for achieving the above-described object, the inventors found that, when an acetone-absorbing ratio and a volume resistivity of an encapsulating material for solar cell are within the predetermined ranges after a crosslinking treatment, it is possible to suppress the PID phenomenon and the generation of air bubbles in a module, and completed the invention.

That is, according to the invention, an encapsulating material for solar cell which is made of a resin composition containing a crosslinkable resin and satisfies the following 1) and 2) is provided.

1) When the encapsulating material for solar cell is immersed in acetone at 23° C. for one hour after a crosslinking treatment in which the encapsulating material for solar cell is heated and depressurized at 150° C. and 250 Pa for three minutes, and then is heated and pressurized at 150° C. and 100 kPa for 15 minutes, an acetone-absorbing ratio is in a range of 3.5 weight % to 12.0 weight % with respect to the weight of the above-described crosslinking-treated encapsulating material for solar cell.

2) A volume resistivity of the above-described crosslinking-treated encapsulating material for solar cell, which is based on JIS K6911 and measured at a temperature of 100° C. with an applied voltage of 500 V, is in a range of $1.0 \times 10^{13}$ Ω·cm to $1.0 \times 10^{18}$ Ω·cm.

In addition, according to the invention, a solar cell module including
 a transparent surface protective member,
 a back surface protective member,
 a solar cell element, and
 an encapsulating layer which is formed by crosslinking the encapsulating material for solar cell and encapsulates the solar cell element between the transparent surface protective member and the back surface protective member
 is provided.

Furthermore, according to the invention, an encapsulating film which is made of a crosslinked resin composition containing a crosslinkable resin, encapsulates the solar cell element, and satisfies the following A) and B) is provided.

A) When the encapsulating film is immersed in acetone at 23° C. for one hour, the acetone-absorbing ratio is in a range of 3.5 weight % to 12.0 weight % with respect to the weight of the above-described encapsulating film.

B) The volume resistivity of the above-described solar cell encapsulating film, which is based on JIS K6911 and measured at a temperature of 100° C. with an applied voltage of 500 V, is in a range of $1.0 \times 10^{13}$ Ω·cm to $1.0 \times 10^{18}$ Ω·cm.

According to the invention, an encapsulating material for solar cell capable of suppressing the PID phenomenon and the generation of air bubbles in a module, and a solar cell module in which the encapsulating material for solar cell is used are provided.

BRIEF DESCRIPTION OF THE DRAWINGS

The above-described object, other objects, characteristics, and advantages will be further clarified using preferable embodiments described below and the following drawings accompanied by the embodiments.

DESCRIPTION OF EMBODIMENTS

Figure 1:
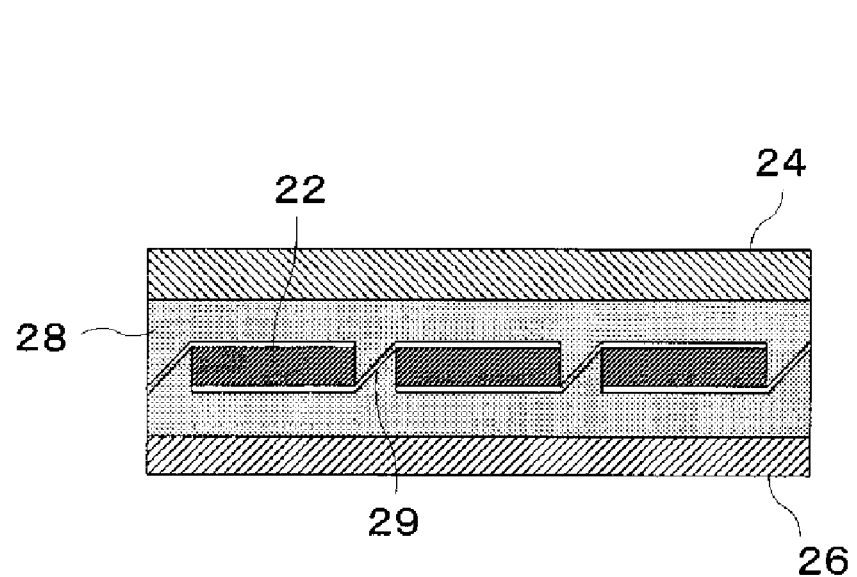
FIG. 1 is a cross-sectional view schematically illustrating an embodiment of a solar cell module of the invention.

Hereinafter, the embodiments of the invention will be described using the drawings. Further, in all the drawings, the same components will be given the same reference numerals and will not be described again as appropriate.

Hereinafter, the embodiments of the invention will be described. Meanwhile, "A to B" indicates "equal to or more than A and equal to or less than B" unless particularly otherwise described.

1. With regard to an encapsulating material for solar cell

An encapsulating material for solar cell of the invention is made of a resin composition containing a crosslinkable resin and satisfies the following 1) and 2).

1) When the encapsulating material for solar cell is immersed in acetone at 23° C. for one hour after a crosslinking treatment in which the encapsulating material for solar cell is heated and depressurized at 150° C. and 250 Pa for three minutes, and then is heated and pressurized at 150° C. and 100 kPa for 15 minutes, an acetone-absorbing ratio is in a range of 3.5 weight % to 12.0 weight % with respect to the weight of the above-described crosslinking-treated encapsulating material for solar cell before the immersion in acetone.

2) A volume resistivity of the encapsulating material for solar cell after the crosslinking treatment in which the encapsulating material for solar cell is heated and depressurized at 150° C. and 250 Pa for three minutes, and then is heated and pressurized at 150° C. and 100 kPa for 15 minutes, which is based on JIS K6911 and measured at a temperature of 100° C. with an applied voltage of 500 V, is in a range of $1.0 \times 10^{13}$ Ω·cm to $1.0 \times 10^{18}$ Ω·cm.

In addition, the encapsulating material for solar cell of the invention preferably further satisfies the following 3).

3) A shore A hardness of the encapsulating material for solar cell after the crosslinking treatment in which the encapsulating material for solar cell is heated and depressurized at 150° C. and 250 Pa for three minutes, and then is heated and pressurized at 150° C. and 100 kPa for 15 minutes, which is measured on the basis of ASTM D2240, is in a range of 50 to 85.

In addition, the encapsulating material for solar cell of the invention preferably further satisfies the following 4).

4) When the encapsulating material for solar cell is immersed in t-butyl alcohol at 30° C. for one hour after the crosslinking treatment in which the encapsulating material for solar cell is heated and depressurized at 150° C. and 250 Pa for three minutes, and then is heated and pressurized at 150° C. and 100 kPa for 15 minutes, a t-butyl alcohol-absorbing ratio is in a range of 2.5 weight % to 6.0 weight % with respect to the weight of the crosslinking-treated encapsulating material for solar cell before the immersion in t-butyl alcohol.

Hereinafter, 1) to 4) will be described. The 1) to 4) characteristics are measured after carrying out the crosslinking treatment on the encapsulating material for solar cell of the invention under specific conditions. The crosslinking treatment is carried out by heating and depressurizing the encapsulating material for solar cell at 150° C. and 250 Pa for three minutes, and then heating and pressurizing the encapsulating material for solar cell at 150° C. and 100 kPa for 15 minutes. Means for measuring the characteristics is not particularly limited as long as the crosslinking treatment can be carried out under the above-described conditions, and the 1) to 4)

characteristics may be measured after the encapsulating material for solar cell of the invention is molded in a sheet shape, is subjected to the crosslinking treatment at the above-described temperature and pressure using a vacuum laminator, a hot press, a crosslinking furnace, or the like, and then is processed to a flat sheet.

(Acetone-Absorbing Ratio)

The acetone-absorbing ratio when the encapsulating material for solar cell of the invention is immersed in acetone at 23° C. for one hour after the crosslinking treatment (hereinafter also simply referred to "acetone-absorbing ratio") is in a range of 3.5 weight % to 12.0 weight %, preferably in a range of 3.8 weight % to 12.0 weight %, and more preferably in a range of 4.0 weight % to 11.0 weight % with respect to the weight of the crosslinking-treated encapsulating material for solar cell before the immersion in acetone. The acetone-absorbing ratio is an index indicating the degree of a decomposed organic peroxide, which is generated when the encapsulating material for solar cell is laminated, that can be absorbed (dissolved) in the encapsulating material for solar cell. When the acetone-absorbing ratio is set to equal to or more than 3.5 weight %, it is possible to sufficiently absorb the decomposed organic peroxide, and air bubbles are not easily generated in a solar cell module. When the acetone-absorbing ratio is set to equal to or less than 12.0 weight %, it is possible to improve the volume resistivity at 100° C. and suppress the occurrence of the PID phenomenon.

To obtain the acetone-absorbing ratio of the encapsulating material for solar cell of the invention after the crosslinking treatment, a test is prepared by, for example, putting 10 ml of acetone into a 100 ml closed container, and cutting and putting into the closed container approximately 1 g of the crosslinking-treated encapsulating material for solar cell, which is weighed using a precision scale, so as to sufficiently immerse the encapsulating material for solar cell in acetone. A crosslinked sheet that provides a test specimen with a thickness in a range of 0.3 mm to 1.2 mm is used. The closed container is put into a constant temperature bath, in which the temperature can be maintained at 23° C., such as an incubator for one hour. After one hour, acetone attached to the sheet surface is wiped away using KIMWIPE or the like, and the sheet after the test is weighed using a precision scale within five minutes after the wiping. The acetone-absorbing ratio is computed from the difference in weight before and after the test.

(Volume Resistivity)

The encapsulating material for solar cell of the invention has a volume resistivity, which is based on JIS K6911 and measured at a temperature of 100° C. with an applied voltage of 500 V, in a range of $1.0\times10^{13}$ Ω·cm to $1.0\times10^{18}$ Ω·cm after the crosslinking treatment. The encapsulating material for solar cell having a large volume resistivity tends to have a characteristic that suppresses the occurrence of the PID phenomenon. Furthermore, while sunlight is being radiated, since there is a case in which the module temperature reaches, for example, equal to or higher than 70° C. in a solar cell module of the related art, the volume resistivity is required under a high-temperature condition rather than at room temperature (23° C.) which has been reported in the related art from the viewpoint of long-term reliability, and the volume resistivity at a temperature of 100° C. becomes important.

The volume resistivity, which is based on JIS K6911 and measured at a temperature of 100° C. with an applied voltage of 500 V (hereinafter also simply referred to as "volume resistivity"), is preferably in a range of $1.0\times10^{13}$ Ω·cm to $1.0\times10^{17}$ Ω·cm, more preferably in a range of $1.0\times10^{13}$ Ω·cm to $1.0\times10^{16}$ Ω·cm, still more preferably in a range of $1.0\times10^{14}$ Ω·cm to $1.0\times10^{16}$ Ω·cm, and most preferably in a range of $5.0\times10^{14}$ Ω·cm to $1.0\times10^{16}$ Ω·cm. When the volume resistivity is equal to or more than $1.0\times10^{13}$ Ω·cm, it is possible to suppress the occurrence of the PID phenomenon for a short period of time (approximately one day) in a constant temperature and humidity test at 85° C. and 85% rh. When the volume resistivity is equal to or less than $1.0\times10^{18}$ Ω·cm, static electricity is not easily generated in the sheet, and therefore it is possible to prevent the adsorption of trash and thus to suppress the degradation of the power generation efficiency or the long-term reliability which is caused by the interfusion of trash into the solar cell module.

Meanwhile, when the volume resistivity is equal to or more than $5.0\times10^{14}$ Ω·cm, there is a tendency that the occurrence of the PID phenomenon can be suppressed for a longer period of time in the constant temperature and humidity test at 85° C. and 85% rh, which is desirable.

(Shore Hardness)

After the crosslinking treatment, the encapsulating material for solar cell of the invention has a shore A hardness, which is measured on the basis of ASTM D2240 (hereinafter also simply referred to as "shore hardness"), preferably in a range of 50 to 85, more preferably in a range of 55 to 85, and still more preferably in a range of 55 to 84. In a case in which an ethylene/based copolymer is used as the crosslinkable resin, the shore A hardness of the crosslinking-treated encapsulating material for solar cell can be adjusted by controlling the content ratio, density, and composition ratio of an ethylene unit in the ethylene/based copolymer and the crosslinking treatment conditions. For example, when the number of the ethylene units in the ethylene/based copolymer is set to be great, the hardness becomes high, and when the number of the ethylene units is set to be small, the hardness becomes low. In addition, there is a tendency that, when the degree of crosslinking is increased by controlling the crosslinking treatment conditions, the crystallinity of the ethylene/based copolymer is decreased, and it is possible to decrease the hardness. Meanwhile, the shore A hardness is measured after 15 seconds or more elapses from the application of a load to a test specimen sheet.

When the shore A hardness of the crosslinking-treated encapsulating material for solar cell is set to equal to or more than 50, the encapsulating material for solar cell does not easily become sticky, and is capable of suppressing blocking. In addition, the feeding property of the sheet can be improved when the encapsulating material for solar cell is processed in a sheet shape, and it is also possible to suppress a decrease in the heat resistance.

Meanwhile, when the shore A hardness of the crosslinking-treated encapsulating material for solar cell is equal to or less than 85, it is possible to improve the transparency, in addition, high flexibility is provided to the encapsulating material for solar cell, and it is possible to suppress the occurrence of cracking in a solar cell element or the chipping of a thin film electrode during the lamination molding of the solar cell module.

(t-Butyl Alcohol-Absorbing Ratio)

The t-butyl alcohol-absorbing ratio when the encapsulating material for solar cell of the invention is immersed in t-butyl alcohol at 30° C. for one hour after the crosslinking treatment (hereinafter, also simply referred to as "t-butyl alcohol-absorbing ratio") is preferably in a range of 2.5 weight % to 6.0 weight %, more preferably in a range of 2.8 weight % to 6.0 weight %, and still more preferably in a range of 3.0 weight % to 5.0 weight % with respect to the weight of the crosslinking-treated encapsulating material for solar cell before the immersion in t-butyl alcohol. The t-butyl alcohol-absorbing ratio is an index indicating the degree of the decomposed organic peroxide, which is generated when the encapsulating material for solar cell is laminated, that can be absorbed (dissolved) in the encapsulating material for solar cell. When the t-butyl alcohol-absorbing ratio is set to equal to or more than 2.5 weight %, it is possible to sufficiently absorb the decomposed organic peroxide, and to suppress the generation of air bubbles in the solar cell module. When the t-butyl alcohol-absorbing ratio is equal to or less than 6.0 weight %, it is possible to increase the volume resistivity at 100° C., and therefore it is possible to suppress the occurrence of the PID phenomenon.

Similar to the above-described acetone-absorbing ratio, the t-butyl alcohol-absorbing ratio of the encapsulating material for solar cell of the invention at 30° C. one hour after the crosslinking treatment can be obtained from a computation with a changed solvent type and a changed test temperature. The reason for testing t-butyl alcohol at 30° C. is that the melting point of t-butyl alcohol is near 25.5° C., and the immersion test is carried out with t-butyl alcohol in a solution form.

Meanwhile, the decomposed organic peroxide is derived from the structural equation of an organic peroxide, and is not limited to acetone (bp: 57° C.) and t-butyl alcohol (bp: 82° C.). Examples thereof include methane, carbon dioxide, ester compounds, t-amyl alcohol (bp: 102° C.), t-hexyl alcohol (bp: 122° C.), 2-ethyl-hexyl alcohol, and the like, alcohol compounds other than the above-described alcohol compounds, and the like. Since methane and carbon dioxide are heated and pressurized in a vacuum state when the solar cell module is laminated using a laminator, during the lamination, methane and carboxylic acid gas are assumed to diffuse in the encapsulating material, be suctioned from the encapsulating material for solar cell so as not to remain in the encapsulating material for solar cell, generate no air bubbles, and impair no appearance of the solar cell module. However, polar compounds including acetone and t-butyl alcohol tend to be partially suctioned, not fully suctioned, remain in the encapsulating material for solar cell, and appear as air bubbles when not absorbed in the encapsulating material for solar cell. As a result, the polar compounds tend to impair the appearance of the solar cell module. The acetone and t-butyl alcohol-absorbing capabilities of the encapsulating material for solar cell are considered to be important as indexes for absorbing the above-described polar compounds.

In addition, as a low-molecular weight component, a methoxy group or an ethoxy group that is bonded with silane in a silane coupling agent is converted to methanol (bp: 64° C.) or ethanol (bp: 78° C.) through hydrolysis. The above-described compounds also have an effect on the generation of air bubbles, and it is considered that a great t-butyl alcohol-absorbing capability contributes to suppressing the generation of air bubbles which is caused by the above-described compounds.

(Crosslinkable Resin)

The resin composition configuring the encapsulating material for solar cell of the invention preferably includes an ethylene/based copolymer as the crosslinkable resin.

The crosslinkable resin is preferably a resin containing one or more selected from copolymers of ethylene and an α-olefin and copolymers composed of ethylene, an α-olefin and a unconjugated polyene, and a copolymer of ethylene and a polar monomer, and is more preferably a resin containing a copolymer of ethylene and a polar monomer, and a copolymer of ethylene and an α-olefin.

The melt flow rate (MFR) of the crosslinkable resin used in the encapsulating material for solar cell of the invention, which is based on ASTM D1238 and measured under conditions of 190° C. and a load of 2.16 kg, is preferably in a range of 10 g/10 minutes to 50 g/10 minutes, more preferably in a range of 10 g/10 minutes to 40 g/10 minutes, still more preferably in a range of 10 g/10 minutes to 35 g/10 minutes, particularly preferably in a range of 12 g/10 minutes to 27 g/10 minutes, and most preferably in a range of 15 g/10 minutes to 25 g/10 minutes. MFR of the crosslinkable resin can be adjusted using the blend ratio between an ethylene/α-olefin copolymer and an ethylene/polar monomer copolymer which will be described below. When MFR is equal to or more than 10 g/10 minutes, the fluidity of the encapsulating material for solar cell improves, and it is possible to improve the productivity during sheet extrusion-molding. In addition, since the scorch property of the encapsulating material for solar cell degrades, it is possible to suppress gelatinization. Therefore, the torque of an extruder decreases, and thus sheet molding can be facilitated. In addition, since it is possible to suppress the generation of a gel-form substance in the extruder after a sheet is obtained, it is possible to suppress the sheet surface becoming uneven and to suppress the degradation of the appearance.

Meanwhile, when a voltage is applied, the presence of a gel-form substance in the sheet causes cracking around the gel-form substance so as to decrease a dielectric breakdown voltage, but the decrease in the dielectric breakdown voltage can be suppressed by setting MFR to equal to or more than 10 g/10 minutes. In addition, when a gel-form substance is present in the sheet, moisture becomes easily permeable at the interface of the gel-form substance, but the degradation of the moisture permeability can be suppressed by setting MFR to equal to or more than 10 g/10 minutes.

In addition, when the sheet surface becomes uneven, the adhesion to the transparent surface protective member such as a glass plate, a cell, an electrode, and the back surface protective member deteriorates during the lamination process of the solar cell module, and the members are not sufficiently adhered together. However, when MFR is set to equal to or less than 50 g/10 minutes, the molecular weight is increased so that it is possible to suppress the attachment to a roll surface of a chilled roll or the like, and therefore peeling is not required, and a sheet having a uniform thickness can be molded. Furthermore, since the resin composition becomes stiff, it is possible to easily mold a sheet having a thickness of equal to or more than 0.3 mm. In addition, since the crosslinking characteristic (particularly, the crosslinking rate) is improved during the lamination molding of the solar cell module, the crosslinkable resin is sufficiently crosslinked so that the degradation of the heat resistance can be suppressed. When MFR is equal to or less than 27 g/10 minutes, it is possible to suppress drawdown during the sheet molding, to mold a sheet having a wide width, to further improve the crosslinking characteristic and the heat resistance, and to obtain the most favorable sheet of the encapsulating material for solar cell.

Regarding the blend ratio between the ethylene/α-olefin copolymer and the ethylene/polar monomer copolymer in the crosslinkable resin contained in the encapsulating material for solar cell of the invention, it is preferable that the ethylene/α-olefin copolymer be in a range of 50 parts by weight to 99 parts by weight and the ethylene/polar monomer copolymer be in a range of 1 part by weight to 50 parts by weight, it is more preferable that the ethylene/α-olefin copolymer be in a range of 50 parts by weight to 98 parts by weight and the ethylene/polar monomer copolymer be in a range of 2 parts by weight to 50 parts by weight, it is still more preferable that the ethylene/α-olefin copolymer be in a range of 50 parts by weight to 95 parts by weight and the ethylene/polar monomer copolymer be in a range of 5 parts by weight to 50 parts by weight, and it is particularly preferable that the ethylene/α-olefin copolymer be in a range of 75 parts by weight to 95 parts by weight and the ethylene/polar monomer copolymer be in a range of 5 parts by weight to 25 parts by weight with respect to a total of 100 parts by weight of the ethylene/α-olefin copolymer and the ethylene/polar monomer copolymer. When the blend ratio of the ethylene/α-olefin copolymer is equal to or more than 50 parts by weight, the volume resistivity of the encapsulating material for solar cell becomes high, and therefore it is possible to suppress the occurrence of the PID phenomenon for a short period of time (approximately one day) in the constant temperature and humidity test at 85° C. and 85% rh. In addition, when the blend ratio of the ethylene/α-olefin copolymer is equal to or less than 99 parts by weight, the acetone and t-butyl alcohol-absorbing ratios of the encapsulating material for solar cell become high after the crosslinking treatment, and the decomposed organic peroxide is sufficiently absorbed so that it is possible to suppress the generation of air bubbles in the solar cell module.

(Ethylene/α-Olefin Copolymer)

The ethylene/α-olefin copolymer used in the encapsulating material for solar cell of the invention is obtained by copolymerizing ethylene and an α-olefin having 3 to 20 carbon atoms. As the α-olefin, generally, it is possible to solely use an α-olefin having 3 to 20 carbon atoms, or to use a combination of two or more α-olefins having 3 to 20 carbon atoms. Examples of the α-olefin having 3 to 20 carbon atoms include straight-chain or branched α-olefins such as propylene, 1-butene, 2-butene, 1-pentene, 3-methyl-1-butene, 3,3-dimethyl-1-butene, 1-hexene, 4-methyl-1-pentene, 3-methyl-1-pentene, 1-octene, 1-decene, and 1-dodecene. Among the above-described α-olefins, an α-olefin having 10 or less carbon atoms is preferred, and an α-olefin having 3 to 8 carbon atoms is particularly preferred. Propylene, 1-butene, 1-pentene, 1-hexene, 4-methyl-1-pentene, and 1-octene are preferred in terms of easy procurement. Meanwhile, the ethylene/α-olefin copolymer may be a random copolymer or a block copolymer, and is preferably a random copolymer from the viewpoint of flexibility.

Furthermore, the ethylene/α-olefin copolymer used in the encapsulating material for solar cell of the invention may be a copolymer composed of ethylene, an α-olefin having 3 to 20 carbon atoms, and a unconjugated polyene. The α-olefin is the same as described above, and examples of the unconjugated polyene include 5-ethylidene-2-norbornene (ENB), 5-vinyl-2-norbornene (VNB), dicyclopentadiene (DCPD), and the like. The unconjugated polyene can be solely used, or a combination of two or more unconjugated polyene can be used.

The ethylene/α-olefin copolymer used in the encapsulating material for solar cell of the invention may be jointly used with an aromatic vinyl compound, 3-phenyl propylene, 4-phenyl propylene, α-methyl styrene, a cyclic olefin having 3 to 20 carbon atoms, or the like. Examples of the aromatic vinyl compound include styrenes such as styrene, o-methyl styrene, m-methyl styrene, p-methyl styrene, o,p-dimethyl styrene, methoxy styrene, vinylbenzoic acid, methyl vinylbenzoate, vinylbenzyl acetate, hydroxystyrene, p-chlorostyrene, and divinylbenzene, and examples of the cyclic olefin include cyclopentene, cycloheptene, norbornene, and 5-methyl-2-norbornene.

Hereinafter, the ethylene/α-olefin copolymer used in the encapsulating material for solar cell of the invention will be described.

(α-Olefin Unit)

The content ratio of a structural unit, which is contained in the ethylene/α-olefin copolymer and is derived from ethylene, is in a range of 80 mol % to 90 mol %, preferably in a range of 80 mol % to 88 mol %, more preferably in a range of 82 mol % to 88 mol %, and still more preferably in a range of 82 mol % to 87 mol %. The ratio of a structural unit (hereinafter, also referred to as "α-olefin unit"), which is contained in the ethylene/α-olefin copolymer and is derived from the α-olefin having 3 to 20 carbon atoms, is in a range of 10 mol % to 20 mol %, preferably in a range of 12 mol % to 20 mol %, more preferably in a range of 12 mol % to 18 mol %, and still more preferably in a range of 13 mol % to 18 mol %.

When the content ratio of the α-olefin unit contained in the ethylene/α-olefin copolymer is set to equal to or more than 10 mol %, high transparency can be obtained. In addition, it is possible to easily carry out extrusion-molding at a low temperature, for example, extrusion-molding at 130° C. or lower is possible. Therefore, even in a case in which the organic peroxide is forcibly inserted into the ethylene/α-olefin copolymer, it is possible to suppress the progress of a crosslinking reaction in an extruder, and to prevent the generation of a gel-form foreign substance in a sheet of the encapsulating material for solar cell and the deterioration of the appearance of the sheet. In addition, since appropriate flexibility can be obtained, it is possible to prevent the occurrence of cracking in the solar cell element or the chipping of the thin film electrode during the lamination molding of the solar cell module.

When the content ratio of the α-olefin unit contained in the ethylene/α-olefin copolymer is set to equal to or less than 20 mol %, the crystallization rate of the ethylene/α-olefin copolymer becomes appropriate, and therefore a sheet extruded from an extruder does not become sticky, the sheet is easily peeled from a cooling roll, and it is possible to efficiently obtain a sheet-shaped sheet of the encapsulating material for solar cell. In addition, since the sheet does not become sticky, blocking can be prevented, and the feeding property of the sheet is favorable. In addition, it is also possible to prevent the degradation of the heat resistance.

(MFR)

The melt flow rate (MFR) of the ethylene/α-olefin copolymer, which is based on ASTM D1238 and measured under conditions of 190° C. and a load of 2.16 kg, is in a range of 5 g/10 minutes to 50 g/10 minutes, preferably in a range of 10 g/10 minutes to 40 g/10 minutes, more preferably in a range of 10 g/10 minutes to 35 g/10 minutes, still more preferably in a range of 10 g/10 minutes to 27 g/10 minutes, and most preferably in a range of 15 g/10 minutes to 25 g/10 minutes. When MFR of the ethylene/α-olefin copolymer is within the above-described range, the ethylene/α-olefin copolymer can be well mixed with the ethylene/polar monomer copolymer described below. In addition, it is possible to satisfy the MFR range of the ethylene/based copolymer, and the extrusion moldability is excellent. Meanwhile, MFR of the ethylene/α-olefin copolymer can be adjusted by adjusting the polymerization temperature and the polymerization pressure during a polymerization reaction described below, the molar ratio between the monomer concentration and the hydrogen concentration in ethylene and the α-olefin in a polymerization system, and the like.

(The Content of Al)

The content (residue amount) of an aluminum element (hereinafter, also expressed as "Al") contained in the ethylene/α-olefin copolymer is preferably in a range of 10 ppm to 500 ppm, more preferably in a range of 20 ppm to 400 ppm, and still more preferably in a range of 20 ppm to 300 ppm. The content of Al is dependent on the concentration of an organic aluminumoxy compound or an organic aluminum compound being added during the polymerization process of the ethylene/α-olefin copolymer.

In a case in which the content of Al is equal to or more than 10 ppm, the organic aluminumoxy compound or the organic aluminum compound can be added during the polymerization process of the ethylene/α-olefin copolymer at a concentration at which the activity of a metallocene compound is sufficiently developed, and therefore it becomes unnecessary to add a compound which reacts with the metallocene compound so as to form an ion pair. In a case in which the compound forming the ion pair is added, there is a case in which the compound forming the ion pair remains in the ethylene/α-olefin copolymer such that the electric characteristics are degraded (for example, there is a tendency of electric characteristics degrading at a high temperature of approximately 100° C.), which can be prevented. In addition, a decrease in the content of Al requires a decalcification treatment using an acid or an alkali, and the acid or the alkali remaining in the obtained ethylene/α-olefin copolymer tends to corrode the electrode. In addition, the decalcification treatment increases the cost of the ethylene/α-olefin copolymer. However, when the content of Al is equal to or more than 10 ppm, the decalcification treatment becomes unnecessary.

In addition, when the content of Al is equal to or less than 500 ppm, it is possible to prevent the progress of the crosslinking reaction in an extruder, and therefore it is possible to prevent the generation of a gel-form foreign substance in a sheet of the encapsulating material for solar cell and the deterioration of the appearance of the sheet.

As a method for controlling the content of the above-described aluminum element contained in the ethylene/α-olefin copolymer, for example, it is possible to control the content of the aluminum element contained in the ethylene/α-olefin copolymer by adjusting the concentrations of (II-1) the organic aluminumoxy compound and (II-2) the organic aluminum compound described in the below-described method for manufacturing the ethylene/α-olefin copolymer in a manufacturing step or the polymerization activity of the metallocene compound among the conditions for manufacturing the ethylene/α-olefin copolymer.

(Shore A Hardness)

The shore A hardness of the ethylene/α-olefin copolymer, which is measured on the basis of ASTM D2240, is in a range of 60 to 85, preferably in a range of 62 to 83, more preferably in a range of 62 to 80, and still more preferably in a range of 65 to 80. The shore A hardness of the ethylene/α-olefin copolymer can be adjusted by controlling the content ratio or density of the ethylene unit in the ethylene/α-olefin copolymer to be within the below-described numeric range. That is, the ethylene/α-olefin copolymer having a high content ratio of the ethylene unit and a high density has a high shore A hardness. On the other hand, the ethylene/α-olefin copolymer having a low content ratio of the ethylene unit and a low density has a low shore A hardness.

When the shore A hardness is equal to or more than 60, the crystallization rate of the ethylene/α-olefin copolymer becomes appropriate, and therefore a sheet extruded from an extruder does not become sticky, the sheet is easily peeled from a cooling roll, and it is possible to efficiently obtain a sheet-shaped sheet of the encapsulating material for solar cell. In addition, since the sheet does not become sticky, blocking can be prevented, and the feeding property of the sheet is favorable. In addition, it is also possible to prevent the degradation of the heat resistance.

On the other hand, when the shore A hardness is equal to or less than 85, high transparency can be obtained. In addition, it is possible to easily carry out extrusion-molding at a low temperature, for example, extrusion-molding at 130° C. or lower is possible. Therefore, even in a case in which the organic peroxide is forcibly inserted into the ethylene/α-olefin copolymer, it is possible to suppress the progress of a crosslinking reaction in an extruder, and to prevent the generation of a gel-form foreign substance in a sheet of the encapsulating material for solar cell and the deterioration of the appearance of the sheet. In addition, since appropriate flexibility can be obtained, it is possible to prevent the occurrence of cracking in the solar cell element or the chipping of the thin film electrode during the lamination molding of the solar cell module.

(Density)

The density of the ethylene/α-olefin copolymer, which is measured on the basis of ASTM D1505, is preferably in a range of 0.865 g/cm$^3$ to 0.884 g/cm$^3$, more preferably in a range of 0.866 g/cm$^3$ to 0.883 g/cm$^3$, still more preferably in a range of 0.866 g/cm$^3$ to 0.880 g/cm$^3$, and particularly preferably in a range of 0.867 g/cm$^3$ to 0.880 g/cm$^3$. The density of the ethylene/α-olefin copolymer can be adjusted using the balance between the content ratio of the ethylene unit and the content ratio of the α-olefin unit. That is, when the content ratio of the ethylene unit is increased, the crystallinity increases, and the ethylene/α-olefin copolymer having a high density can be obtained. On the other hand, when the content ratio of the ethylene unit is decreased, the crystallinity decreases, and the ethylene/α-olefin copolymer having a low density can be obtained.

When the density of the ethylene/α-olefin copolymer is equal to or less than 0.884 g/cm$^3$, the crystallinity becomes low, and it is possible to increase the transparency. Furthermore, extrusion-molding at a low temperature becomes easy, and, for example, it is possible to carry out extrusion-molding at 130° C. or lower. Therefore, even when the organic peroxide is forcibly inserted into the ethylene/α-olefin copolymer, it is possible to prevent the progress of a crosslinking reaction in an extruder, to suppress the generation of a gel-form foreign substance in the sheet of the encapsulating material for solar cell, and to suppress the deterioration of the appearance of the sheet. In addition, since the flexibility is high, it is possible to prevent the occurrence of cracking in a cell which is the solar cell element or the chipping of the thin film electrode during the lamination molding of the solar cell module.

On the other hand, when the density of the ethylene/α-olefin copolymer is equal to or more than 0.865 g/cm$^3$, it is possible to increase the crystallization rate of the ethylene/α-olefin copolymer, and therefore a sheet extruded from an extruder does not become sticky, the sheet is easily peeled from a cooling roll, and it is possible to easily obtain a sheet of the encapsulating material for solar cell. In addition, since the sheet does not become sticky, it is possible to suppress the occurrence of blocking and improve the feeding property of the sheet. In addition, since the sheet is sufficiently crosslinked, it is possible to suppress the degradation of the heat resistance.

(B Value)

AB value of the ethylene/α-olefin copolymer, which is obtained from the $^{13}$C-NMR spectrum and the following equation (1), is preferably in a range of 0.9 to 1.5, more preferably in a range of 0.9 to 1.3, still more preferably in a range of 0.95 to 1.3, particularly preferably in a range of 0.95 to 1.2, and most preferably in a range of 1.0 to 1.2. The B value can be adjusted by changing a polymerization catalyst when the ethylene/α-olefin copolymer is polymerized. More specifically, the ethylene/α-olefin copolymer having a B value in the above-described numeric range can be obtained using the metallocene compound described below.

$$B \text{ value} = [P_{OE}]/(2 \times [P_O] \times [P_E]) \quad (1)$$

(In the equation (1), $[P_E]$ represents the proportion (molar fraction) of the structural unit derived from ethylene in the ethylene/α-olefin copolymer, $[P_O]$ represents the proportion (molar fraction) of the structural unit derived from an α-olefin having 3 to 20 carbon atoms in the ethylene/α-olefin copolymer, and $[P_{OE}]$ represents the proportion (molar fraction) of α-olefin/ethylene chain in total dyad chain.)

The B value is an index indicating the distribution state of the ethylene unit and the α-olefin unit in the ethylene/α-olefin copolymer, and can be obtained based on the report by J. C. Randall (Macromolecules, 15, 353 (1982), J. Ray (Macromolecules, 10, 773 (1977))).

As the B value increases, the block chain of the ethylene unit or the α-olefin copolymer becomes shorter, and a high B value indicates that the distribution of the ethylene unit and the α-olefin unit is uniform and the composition distribution of copolymer rubber is narrow. Meanwhile, when the B value is equal to or more than 0.9, it is possible to decrease the composition distribution of the ethylene/α-olefin copolymer. Particularly, since the block chain of the ethylene unit becomes small, and extrusion-molding at a low temperature becomes easy, for example, it is possible to carry out extrusion-molding at 130° C. or lower. Therefore, even in a case in which the organic peroxide is forcibly inserted into the ethylene/α-olefin copolymer, it is possible to suppress the progress of a crosslinking reaction in an extruder, and to prevent the generation of a gel-form foreign substance in a sheet of the encapsulating material for solar cell and the deterioration of the appearance of the sheet.

(Tαβ/Tαα)

The intensity ratio (Tαβ/Tαα) of Tαβ to Tαα of the ethylene/α-olefin copolymer in the $^{13}$C-NMR spectrum is preferably equal to or less than 1.5, more preferably equal to or less than 1.2, particularly preferably equal to or less than 1.0, and most preferably equal to or less than 0.7. Tαβ/Tαα can be adjusted by changing a polymerization catalyst when the ethylene/α-olefin copolymer is polymerized. More specifically, the ethylene/α-olefin copolymer having a Tαβ/Tαα in the above-described numeric range can be obtained using the metallocene compound described below.

Tαα and Tαβ in the $^{13}$C-NMR spectrum correspond to the peak intensities of "CH$_2$" in the structural unit derived from an α-olefin having 3 or more carbon atoms. More specifically, Tαα and Tαβ represent the peak intensities of two types of "CH$_2$" having different locations with respect to ternary carbon atoms respectively as illustrated in the following general equation (2).

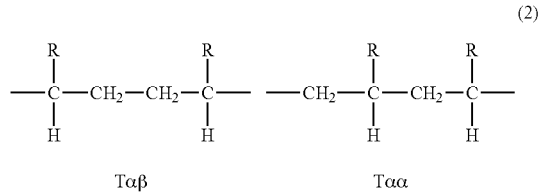

Tαβ/Tαα can be obtained in the following manner. The $^{13}$C-NMR spectrum of the ethylene/α-olefin copolymer is measured using an NMR measurement device (for example, trade name "JEOL-GX270" manufactured by JEOL, Ltd.). The measurement is carried out using a solution mixture of hexachlorobutadiene and d6-benzene (at a volume ratio of 2/1) which has been prepared to provide a specimen concentration of 5 weight % and a standard of d6-benzene (128 ppm) at 67.8 MHz and 25° C. The measured $^{13}$C-NMR spectrum is analyzed according to Lindemann-Adams' proposal (Analysis Chemistry, 43, p 1245 (1971)), and J. C. Randall (Review Macromolecular Chemistry Physics, C29, 201 (1989)), and Tαβ/Tαα is obtained.

The intensity ratio (Tαβ/Tαα) of Tαβ to Tαα of the ethylene/α-olefin copolymer in the $^{13}$C-NMR indicates the coordination state of the α-olefin with respect to the polymerization catalyst during the polymerization reaction. In a case in which the α-olefin is coordinated with respect to the polymerization catalyst in a Tαβ form, the substituent in the α-olefin hinders the polymerization growth reaction of a polymer chain, and tends to promote the generation of a low molecular weight component. As a result, there is a tendency that the sheet becomes sticky and blocked, and the feeding property of the sheet deteriorates. Furthermore, since the low molecular weight component spreads on the sheet surface, adhesiveness is hindered, and the adhesiveness is degraded.

(Molecular Weight Distribution Mw/Mn)

The molecular weight distribution Mw/Mn of the ethylene/α-olefin copolymer, which is represented by the ratio of the weight-average molecular weight (Mw) to the number-average molecular weight (Mn) measured through gel permeation chromatography (GPC), is preferably in a range of 1.2 to 3.5, more preferably in a range of 1.7 to 3.0, still more preferably in a range of 1.7 to 2.7, and particularly preferably in a range of 1.9 to 2.4. The molecular weight distribution Mw/Mn of the ethylene/α-olefin copolymer can be adjusted using the metallocene compound described below during the polymerization.

When the Mw/Mn is set to equal to or more than 1.2, it is possible to obtain the catalyst activity for polymerizing the ethylene/α-olefin copolymer in a living polymerization manner. Alternately, since it becomes unnecessary to separate the low molecular weight component and high molecular weight component of the ethylene/α-olefin copolymer obtained using a well-known polymerization method of the related art, it is possible to decrease the manufacturing cost. In addition, since the temperature width in which molding is possible is narrow, and furthermore, the ejection amount in an extruder becomes uniform, it is possible to obtain a sheet having a uniform thickness, and sheet molding becomes easy.

Generally, it is known that, when the molecular weight distribution Mw/Mn becomes wide, the composition distribution also becomes wide. However, when the Mw/Mn is equal to or less than 3.5, the amount of the low molecular weight component becomes small, and therefore the sheet does not become sticky and is not easily blocked so that the feeding property of the sheet can be improved. In addition, since the bleeding of the low molecular weight component onto the sheet surface is prevented, it is possible to suppress the degradation of the adhesiveness.

In the present specification, the ratio (Mw/Mn) of the weight-average molecular weight (Mw) to the number-average molecular weight (Mn) is measured in the following manner using a gel permeation chromatography manufactured by Waters (trade name: "ALLIANCE GPC-2000"). Two TSKgel GMH6-HT (trade name) columns and two TSKgel GMH6-HTL (trade name) columns are used as separation columns. Regarding the column size, an inner diameter of 7.5 mm and a length of 300 mm are provided to all columns, the column temperature is set to 140° C., o-dichlorobenzene (manufactured by Wako Pure Chemical Industries, Ltd.) is used as a mobile phase, and 0.025 weight % of BHT (manufactured by Takeda Pharmaceutical Company Limited) is used as an antioxidant. The mobile phase is moved at a rate of 1.0 ml/minute so as to set the specimen concentration to 15 mg/10 ml, the specimen injection amount is set to 500 μl, and a differential refractometer is used as a detector. Polystyrene manufactured by Tosoh Corporation is used as the standard polystyrene for the ethylene/α-olefin copolymer having a molecular weight satisfying Mw≤1000 and Mw≥4×10$^6$. In addition, polystyrene manufactured by Pressure Chemical Corporation is used as the standard polystyrene for the ethylene/α-olefin copolymer having a molecular weight satisfying 1000≤Mw≤4×10$^6$. The molecular weight is the value of the ethylene/α-olefin copolymer converted in accordance with each of the used α-olefins through universal correction.

(the Content Ratio of Chlorine Ions)

The content ratio of chlorine ions in the ethylene/α-olefin copolymer, which is detected from an extraction liquid after a solid-phase extraction treatment through ion chromatography, is preferably equal to or less than 2 ppm, more preferably equal to or less than 1.5 ppm, and particularly preferably equal to or less than 1.2 ppm. The content ratio of chlorine ions can be adjusted by adjusting the structure and polymerization conditions of the metallocene compound described below. That is, when the polymerization activity of the catalyst is increased, the amount of a catalyst residue in the ethylene/α-olefin copolymer is decreased, and the ethylene/α-olefin copolymer having a content ratio of chlorine ions within the above-described numeric range can be obtained.

When the content ratio of chlorine ions in the ethylene/α-olefin copolymer is set to equal to or less than 2 ppm, it is possible to prevent a problem of the long-term reliability of the solar cell module being degraded by the corrosion of an electrode made of silver and the like. Meanwhile, when the metallocene compound including no chlorine atom is used, it is possible to obtain the ethylene/α-olefin copolymer substantially containing no chlorine ion.

The content ratio of chlorine ions in the ethylene/α-olefin copolymer can be measured using an extraction liquid, which is obtained by, for example, precisely weighing approximately 10 g of the ethylene/α-olefin copolymer in a glass container that has been sterilized and washed using an autoclave or the like, adding 100 ml of ultrapure water, closely encapsulating the glass container, and then carrying out ultrasonic wave (38 kHz) extraction at room temperature for 30 minutes, and an ion chromatography device manufactured by Dionex Ltd. (trade name "ICS-2000").

(The Extraction Amount into Methyl Acetate)

The extraction amount of the ethylene/α-olefin copolymer into methyl acetate is preferably equal to or less than 5.0 weight %, more preferably equal to or less than 4.0 weight %, still more preferably equal to or less than 3.5 weight %, and particularly preferably equal to or less than 2.0 weight %. A large extraction amount into methyl acetate indicates that a large amount of a low molecular weight component is contained in the ethylene/α-olefin copolymer and the molecular weight distribution or the composition distribution is wide. Therefore, it is possible to obtain the ethylene/α-olefin copolymer having a small extraction amount into methyl acetate using the metallocene compound described below by adjusting the polymerization conditions.

For example, when the metallocene compound having a decreased polymerization activity is emitted outside a polymerization system by shortening the polymerization retention time in a polymerization vessel, it is possible to suppress the generation of the low molecular weight component. When the extraction amount into methyl acetate is equal to or less than 5.0 weight % in a Soxhlet extraction method, the sheet does not become sticky, and therefore it is possible to suppress blocking and to improve the feeding property of the sheet.

The extraction amount into methyl acetate is computed by, for example, precisely weighing approximately 10 g of the ethylene/α-olefin copolymer, carrying out Soxhlet extraction using methyl acetate at a temperature that is equal to or higher than the boiling point of methyl acetate, and using the weight difference of the ethylene/α-olefin copolymer before and after the extrusion or the residue amount obtained after the extracted solvent is volatilized.

(Melting Peak)

The differential scanning calorimetry (DSC)-based melting peak of the ethylene/α-olefin copolymer is preferably present in a range of 30° C. to 90° C., more preferably present in a range of 33° C. to 90° C., and particularly preferably present in a range of 33° C. to 88° C. When the melting peak is 90° C. or lower, the degree of crystallinity becomes low, and the flexibility of the obtained encapsulating material for solar cell becomes favorable, and therefore it is possible to prevent the occurrence of cracking in a cell or the chipping of the thin film electrode during the lamination molding of the solar cell module. On the other hand, when the melting peak is 30° C. or higher, it is possible to provide appropriately favorable flexibility to the resin composition, and therefore it is possible to easily obtain a sheet of the encapsulating material for solar cell through extrusion-molding. In addition, it is possible to prevent the sheet from becoming sticky and blocked, and to suppress the deterioration of the feeding property of the sheet.

(Method for Manufacturing the Ethylene/α-Olefin Copolymer)

The ethylene/α-olefin copolymer can be manufactured using a Ziegler compound, a vanadium compound, a metallocene compound, or the like as a catalyst. Among the above-described compounds, it is preferable to use any one of a variety of metallocene compounds described below as a catalyst when the ethylene/α-olefin copolymer is manufactured. Examples of the metallocene compounds that can be used include metallocene compounds described in Japanese Unexamined Patent Publication No. 2006-077261, Japanese Unexamined Patent Publication No. 2008-231265, Japanese Unexamined Patent Publication No. 2005-314680, and the like. However, a metallocene compound having a different structure from those of the metallocene compounds described in the above-described patent documents may also be used, and a combination of two or more metallocene compounds may also be used.

Preferable examples of a polymerization reaction in which the metallocene compound is used include the following aspects.

Ethylene and one or more monomers selected from α-olefins and the like are supplied in the presence of a catalyst for olefin polymerization composed of a well-known metallocene compound of the related art and at least one compound (also referred to as a promoter) selected from a group consisting of (II) (II-1) the organic aluminumoxy compound, (II-2) compounds that react with the metallocene compound (I) so as to form an ion pair, and (II-3) the organic aluminum compound.

As (II-1) the organic aluminumoxy compound, (II-2) the compounds that react with the metallocene compound (I) so as to form an ion pair, and (II-3) the organic aluminum compound, for example, the metallocene compounds described in Japanese Unexamined Patent Publication No. 2006-077261, Japanese Unexamined Patent Publication No. 2008-231265, Japanese Unexamined Patent Publication No. 2005-314680, and the like can be used. However, a metallocene compound having a different structure from those of the metallocene compounds described in the above-described patent documents may also be used. The above-described compounds may be individually injected into a polymerization atmosphere or be brought into contact with each other in advance and then injected into a polymerization atmosphere. Furthermore, for example, the compounds may be carried by the fine particle-shaped inorganic oxide carrier described in Japanese Unexamined Patent Publication No. 2005-314680 or the like.

Meanwhile, preferably, when the ethylene/α-olefin copolymer is manufactured without substantially using (II-2) the compound that reacts with the metallocene compound (I) so as to form an ion pair, it is possible to obtain the ethylene/α-olefin copolymer having excellent electric characteristics.

The polymerization of the ethylene/α-olefin copolymer can be carried out using any one of a well-known gas-phase polymerization method of the related art and a liquid-phase polymerization method such as a slurry polymerization method or a solution polymerization method. The polymerization is preferably carried out using the liquid-phase polymerization method such as the solution polymerization method. In a case in which the ethylene/α-olefin copolymer is manufactured by carrying out the copolymerization of ethylene and an α-olefin having 3 to 20 carbon atoms using the metallocene compound, (I) the metallocene compound is used in an amount in a range of, generally, $10^{-9}$ mole to $10^{-1}$ mole, and preferably $10^{-8}$ mole to $10^{-2}$ mole per a reaction volume of one liter.

The compound (II-1) is used in an amount in which the molar ratio [(II-1)/M] of the compound (II-1) to all transition metal atoms (M) in the compound (I) is generally in a range of 1 to 10000, and preferably in a range of 10 to 5000. The compound (II-2) is used in an amount in which the molar ratio [(II-2)/M] of the compound (II-2) to all the transition metal atoms (M) in the compound (I) is generally in a range of 0.5 to 50, and preferably in a range of 1 to 20. The compound (II-3) is used in an amount in a range of, generally, 0 millimoles to 5 millimoles, and preferably approximately 0 millimoles to 2 millimoles per a polymerization volume of one liter.

In the solution polymerization method, when ethylene and an α-olefin having 3 to 20 carbon atoms are copolymerized in the presence of the above-described metallocene compound, it is possible to efficiently manufacture an ethylene/α-olefin copolymer having a large content of a comonomer, a narrow composition distribution, and a narrow molecular weight distribution. Here, the preliminary molar ratio of ethylene to the α-olefin having 3 to 20 carbon atoms is generally in a range of 10:90 to 99.9:0.1, preferably in a range of 30:70 to 99.9:0.1, and more preferably in a range of 50:50 to 99.9:0.1 (ethylene: α-olefin).

The "solution polymerization method" is a collective term for all methods in which polymerization is carried out in a state in which a polymer is dissolved in an inert hydrocarbon solvent described below. In the solution polymerization method, the polymerization temperature is generally in a range of 0° C. to 200° C., preferably in a range of 20° C. to 190° C., and more preferably in a range of 40° C. to 180° C. In a case in which the polymerization temperature fails to satisfy 0° C., the solution polymerization method is not practical in terms of productivity since the polymerization activity is extremely degraded, and the removal of polymerization heat becomes difficult. In a case in which the solution polymerization temperature exceeds 200° C., the solution polymerization method is not practical in terms of productivity since the polymerization activity is extremely degraded.

The polymerization pressure is generally in a range of normal pressure to 10 MPa (gauge pressure), and preferably in a range of normal pressure to 8 MPa (gauge pressure). Copolymerization can be carried out in all of a batch method, a semi-continuous method, and a continuous method. The reaction time (the average retention time in a case in which a copolymer reaction is carried out using a continuous method) varies depending on the conditions such as the catalyst concentration and the polymerization temperature, and can be appropriately selected, but is generally in a range of one minute to three hours, and preferably in a range of ten minutes to 2.5 hours. Furthermore, it is also possible to carry out the polymerization in two or more steps with different reaction conditions. The molecular weight of the obtained ethylene/α-olefin copolymer can be adjusted by changing the concentration of hydrogen or the polymerization temperature in the polymerization system. Furthermore, the molecular weight of the ethylene/α-olefin copolymer can also be adjusted using the amount of the compound (II) being used. In a case in which hydrogen is added, the amount of hydrogen is appropriately in a range of approximately 0.001 NL to 5000 NL per kilogram of the ethylene/α-olefin copolymer being generated. In addition, a vinyl group and a vinylidene group present at the ends of a molecule in the obtained ethylene/α-olefin copolymer can be adjusted by increasing the polymerization temperature and extremely decreasing the amount of hydrogen being added.

A solvent used in the solution polymerization method is generally an inert hydrocarbon solvent, and is preferably a saturated hydrocarbon having a boiling point in a range of 50° C. to 200° C. at normal pressure. Specific examples thereof include aliphatic hydrocarbon such as pentane, hexane, heptane, octane, decane, dodecane, and kerosene; and alicyclic hydrocarbon such as cyclopentane, cyclohexane, and methylcyclopentane. Meanwhile, aromatic hydrocarbons such as benzene, toluene, and xylene and halogenated hydrocarbon such as ethylene chloride, chlorobenzene, and dichlorobenzene also belong to the scope of the "inert hydrocarbon solvent", and the use thereof is not limited.

As described above, in the solution polymerization method, not only the organic aluminumoxy compound dissolved in the aromatic hydrocarbon, which was frequently used in the related art, but also modified methyl aluminoxane dissolved in the aliphatic hydrocarbon or the alicyclic hydrocarbon such as MMAO can be used. As a result, when the aliphatic hydrocarbon or the alicyclic hydrocarbon is employed as the solvent for the solution polymerization, it becomes possible to almost completely eliminate the possibility of the aromatic hydrocarbon being interfused into the polymerization system or the ethylene/α-olefin copolymer being generated. That is, the solution polymerization method also has characteristics in that the environmental load can be reduced and the influence on human health can be minimized. Meanwhile, to suppress the variation in properties, it is preferable to melt the ethylene/α-olefin copolymer obtained through the polymerization reaction and other components added as desired using an arbitrary method, and to knead and granulate the ethylene/α-olefin copolymer and other components.

(Ethylene/Polar Monomer Copolymer)

The ethylene/polar monomer copolymer used for the encapsulating material for solar cell of the invention is a random copolymer of ethylene and a polar monomer. Examples of the polar monomer include one or more of unsaturated carboxylic acids such as acrylic acid, methacrylic acid, fumaric acid, itaconic acid, monomethyl maleate, monoethyl maleate, maleic anhydride, and itaconic acid anhydride; unsaturated carboxylic acid esters such as methyl acrylate, ethyl acrylate, isopropyl acrylate, isobutyl acrylate, n-butyl acrylate, isooctylacrylate, methyl methacrylate, ethyl methacrylate, isobutyl methacrylate, and dimethyl maleate; unsaturated glycidyl carboxylic acid esters such as glycidyl acrylate ester and glycidyl methacrylate ester; unsaturated glycidyl carboxylic acid ethers such as glycidyl acrylate ether and glycidyl methacrylate ether; and vinyl esters such as vinyl acetate and vinyl propionate.

Specific examples of the ethylene/polar monomer copolymer include ethylene/unsaturated carboxylic acid copolymers such as ethylene/acrylic acid copolymers and ethylene/methacrylic acid copolymers; ethylene/unsaturated carboxylic anhydride copolymers such as ethylene/maleic anhydride copolymers and ethylene/itaconic acid anhydride copolymers; ethylene/unsaturated carboxylic acid ester copolymers such as ethylene/methyl acrylate copolymers, ethylene/ethyl acrylate copolymers, ethylene/methyl methacrylate copolymers, ethylene/isobutyl acrylate copolymers, and ethylene/n-butyl acrylate copolymers; ethylene/unsaturated carboxylic acid ester/unsaturated carboxylic acid copolymers such as ethylene/isobutyl acrylate/methacrylic acid copolymers and ethylene/n-butyl acrylate/methacrylic acid copolymers; ethylene/unsaturated glycidyl ester copolymers such as ethylene/glycidyl acrylate ester copolymers; ethylene/unsaturated glycidyl ether copolymers such as ethylene/glycidyl acrylate ether copolymers; ethylene/unsaturated glycidyl ester/unsaturated carboxylic acid ester copolymers such as ethylene/glycidyl acrylate ester/methyl acrylate copolymers; ethylene/unsaturated glycidyl ester/unsaturated carboxylic acid ether copolymers such as ethylene/glycidyl acrylate ether/methyl acrylate copolymers; ethylene/vinyl ester copolymers such as ethylene/vinyl acetate copolymers; and the like, and the above-described ethylene/polar monomer copolymers can be used as a mixture of one or more ethylene/polar monomer copolymers. Among the above-described ethylene/polar monomer copolymers, ethylene/unsaturated glycidyl ester copolymers, ethylene/unsaturated glydicyl ether copolymers, ethylene/unsaturated glycidyl ester/unsaturated carboxylic acid ester copolymers, ethylene/unsaturated glycidyl ether/unsaturated carboxylic acid ester copolymers, ethylene/vinyl ester copolymers, and the like are preferred.

The content of the polar monomer in the ethylene/polar monomer copolymer is in a range of 15 weight % to 50 weight %, preferably in a range of 15 weight % to 40 weight %, and more preferably in a range of 20 weight % to 40 weight %. When the content of the polar monomer is within the above-described range, the balance between the acetone and t-butyl alcohol-absorbing ratios and the shore A hardness of the ethylene/based copolymer improves, and extrusion-molding is possible.

Among the above-described ethylene/polar monomer copolymers, the ethylene/vinyl acetate copolymers are most preferred, and the content of vinyl acetate in the ethylene/vinyl acetate copolymer is in a range of 15 weight % to 47 weight %, and preferably in a range of 20 weight % to 40 weight %. When the content of vinyl acetate in the ethylene/vinyl acetate copolymer is within the above-described range, the balance between the acetone and t-butyl alcohol-absorbing ratios and the shore A hardness of the ethylene/based copolymer improves, and extrusion-molding is possible.

The melt flow rate (MFR) of the ethylene/vinyl acetate copolymer, which is based on ASTM D1238 and measured under conditions of 190° C. and a load of 2.16 kg, is in a range of 5 g/10 minutes to 50 g/10 minutes, preferably in a range of 5 g/10 minutes to 30 g/10 minutes, and more preferably in a range of 5 g/10 minutes to 25 g/10 minutes. When MFR of the ethylene/polar monomer copolymer is within the above-described range, the ethylene/polar monomer copolymer can be well mixed with the above-described ethylene/α-olefin copolymer. In addition, it is possible to satisfy the MFR range of the ethylene/based copolymer, and the extrusion moldability is excellent. In addition, MFR of the ethylene/polar monomer copolymer can be adjusted by adjusting the polymerization temperature and the polymerization pressure during the polymerization reaction described below, the molar ratio between the monomer concentration and the hydrogen concentration in the polar monomer in the polymerization system, and the like.

(Method for Manufacturing the Ethylene/Polar Monomer Copolymer)

The ethylene/polar monomer copolymer used in the encapsulating material for solar cell of the invention is a copolymer containing the above-described monomer unit, and the copolymer can be manufactured by, for example, copolymerizing the monomer unit in the presence of a radical-generating agent at a pressure in a range of 500 atmospheric pressure to 4000 atmospheric pressure and a temperature in a range of 100° C. to 300° C. in the presence or absence of a solvent or a chain transfer agent. In addition, the ethylene/polar monomer copolymer can also be manufactured through molten graft polymerization of a mixture composed of a polyethylene, an unsaturated compound having a glycidyl group, and a radical-generating agent, and the like using an extruder or the like.

(Silane Coupling Agent)

The resin composition configuring the encapsulating material for solar cell of the invention can also contain a silane coupling agent. A preferable aspect is that the content of the silane coupling agent is in a range of 0.1 parts by weight to 2 parts by weight with respect to 100 parts by weight of the crosslinkable resin. The content of the silane coupling agent is more preferably in a range of 0.1 parts by weight to 1.8 parts by weight and particularly preferably in a range of 0.1 parts by weight to 1.5 parts by weight.

When the content of the silane coupling agent is equal to or more than 0.1 parts by weight, the adhesiveness is improved. On the other hand, when the content of the silane coupling agent is equal to or less than 2 parts by weight, the amount of methanol and ethanol in the silane coupling agent, which are derived from a methoxy group and an ethoxy group and are generated due to hydrolysis, is decreased, and it is possible to more reliably suppress the generation of air bubbles. In addition, the addition amount of the organic peroxide for causing a graft reaction between the silane coupling agent and the ethylene/based copolymer during the lamination of the solar cell module is decreased, and therefore it is possible to decrease the amounts of decomposed acetone and decomposed t-butyl alcohol, and to more reliably suppress the generation of air bubbles.

A well-known silane coupling agent of the related art can be used as the silane coupling agent, and there is no particular limitation. Specific examples thereof that can be used include vinyltriethoxysilane, vinyl trimethoxysilane, vinyl tris(β-methoxyethoxy)silane, 2-(3,4-epoxy cyclohexyl)ethyl trimethoxysilane, 3-glycidoxy propyl methyl dimethoxysilane, 3-glycidoxy propyl trimethoxysilane, 3-glycidoxy propyl methyl diethoxysilane, 3-glycidoxy propyl triethoxysilane, p-styryl trimethoxysilane, 3-aminopropyl triethoxysilane, 3-aminopropyl trimethoxysilane, N-2-(aminoethyl)-3-aminopropyl methyl dimethoxysilane, N-2-(aminoethyl)-3-aminopropyl trimethoxysilane, 3-triethoxysilyl-N-(1,3-dimethyl-butylidene)propylamine, N-phenyl-3-aminopropyl trimethoxysilane, 3-ureidopropyl triethoxysilane, 3-isocyanate propyl triethoxysilane, 3-methacryloxypropyl trimethoxysilane, 3-methacryloxypropyl methyl dimethoxysilane, 3-methacryloxypropyl methyl dimethoxysilane, 3-methacryloxypropyl triethoxysilane, 3-methacryloxypropyl methyl diethoxysilane, 3-acryloxypropyl trimethoxysilane, and the like. Preferable examples thereof include 3-glycidoxy propyl trimethoxysilane, 3-glycidoxypropyl triethoxysilane, 3-aminopropyl triethoxysilane, 3-methacryloxypropyl trimethoxysilane, 3-methacryloxypropyl triethoxysilane, 3-acryloxypropyl trimethoxysilane, and vinyltriethoxysilane due to their favorable adhesiveness.

(Organic Peroxide)

The resin composition configuring the encapsulating material for solar cell of the invention can also contain an organic peroxide. The organic peroxide is used as a radical initiator during the graft modification of the silane coupling agent and the ethylene/based copolymer, and furthermore, is used as a radial initiator during a crosslinking reaction when the ethylene/based copolymer is lamination-molded to the solar cell module. When the silane coupling agent is graft-modified in the ethylene/based copolymer, a solar cell module having a favorable adhesiveness to glass, a backsheet, a cell, and an electrode is obtained. Furthermore, when the ethylene/based copolymer is crosslinked, a solar cell module having excellent heat resistance and adhesiveness can be obtained.

Any organic peroxide may be used as the organic peroxide that is preferably used in the encapsulating material for solar cell as long as the organic peroxide is capable of graft-modifying the silane coupling agent in the ethylene/based copolymer or crosslinking the ethylene/based copolymer, and the one-minute half-life temperature of the organic peroxide is in a range of 100° C. to 170° C. in consideration of the balance between the productivity during extrusion sheet molding and the crosslinking rate during the lamination molding of the solar cell module. When the one-minute half-life temperature of the organic peroxide is 100° C. or higher, it becomes difficult for a gel to be generated in a sheet of the encapsulating material for solar cell obtained from the resin composition during the extrusion sheet molding, and therefore it is possible to suppress an increase in the torque of the extruder and to facilitate sheet molding. In addition, since it is possible to suppress the sheet surface becoming uneven due to a gel-form substance in the extruder, the degradation of the appearance can be prevented. In addition, since it is possible to prevent the occurrence of cracking in the sheet when a voltage is applied, a decrease in the dielectric breakdown voltage can be prevented. Furthermore, the degradation of the moisture permeability can also be prevented. In addition, since it is possible to suppress the sheet surface becoming uneven, the adhesion to a glass plate, a cell, an electrode and a backsheet becomes favorable during the lamination process of the solar cell module, and the adhesiveness also improves. When the extrusion temperature of the extrusion sheet molding is decreased to 90° C. or lower, while the molding is possible, the productivity significantly degrades. When the one-minute half-life temperature of the organic peroxide is 170° C. or lower, it is possible to suppress a decrease in the crosslinking rate during the lamination molding of the solar cell module, and therefore it is possible to prevent the degradation of the productivity of the solar cell module. In addition, it is also possible to prevent the degradation of the heat resistance and adhesiveness of the encapsulating material for solar cell.

A well-known organic peroxide can be used as the organic peroxide. Specific examples of the preferable organic peroxide having a one-minute half-life temperature in a range of 100° C. to 170° C. include dilauroyl peroxide, 1,1,3,3-tetramethylbutyl peroxy-2-ethylhexanoate, dibenzoyl peroxide, t-amylperoxy-2-ethylhexanoate, t-butylperoxy-2-ethylhexanotae, t-butylperoxy isobutyrate, t-butylperoxy maleate, 1,1-di(t-amylperoxy)-3,3,5-trimethylcyclohexane, 1,1-di(t-amylpeoxy)cyclohexane, t-amylperoxy isononanoate, t-amylperoxy normaloctoate, 1,1-di(t-butylperoxy)-3,3,5-trimethylcyclohexane, 1,1-di(t-butylperoxy)cyclohexane, t-butylperoxy isopropyl carbonate, t-butylperoxy-2-ethylhexylcarbonate, 2,5-dimethyl-2,5-di(benzoylperoxy)hexane, t-amyl-peroxybenzoate, t-butylperoxy acetate, t-butylperoxy isononanoate, 2,2-di(t-butylperoxy)butane, t-butylperoxy benzoate, and the like. Preferable examples thereof include dilauroyl peroxide, t-butylperoxy isopropyl carbonate, t-butyl proxy acetate, t-butylperoxy isononanoate, t-butylperoxy-2-ethylhexyl carbonate, t-butylperoxy benzoate, and the like.

Since the encapsulating material for solar cell of the invention contains the organic peroxide and thus has excellent crosslinking characteristics, a two-phase adhering step in a vacuum laminator and a crosslinking furnace is not required, and the encapsulating material for solar cell can be completed at a high temperature within a short period of time.

In the encapsulating material for solar cell of the invention, the content of the organic peroxide is in a range of 0.1 parts by weight to 1.2 parts by weight with respect to 100 parts by weight of the crosslinkable resin. The content of the organic peroxide is preferably in a range of 0.2 parts by weight to 1.0 part by weight, and more preferably in a range of 0.2 parts by weight to 0.8 parts by weight.

When the content of the organic peroxide is equal to or more than 0.1 parts by weight, the degradation of the crosslinking characteristics such as the crosslinking degree or crosslinking rate of the encapsulating material for solar cell is suppressed, and the graft reaction of the silane coupling agent with the main chain of the ethylene/based copolymer becomes favorable, whereby it is possible to suppress the degradation of the heat resistance and the adhesiveness.

When the content of the organic peroxide is equal to or less than 1.2 parts by weight, the generation amount of the decomposition product and the like of acetone, t-butyl alcohol and other organic peroxides is further decreased, and it is possible to reliably prevent the generation of air bubbles.

(Ultraviolet Absorber, Light Stabilizer, and Heat-Resistant Stabilizer)

The resin composition configuring the encapsulating material for solar cell of the invention preferably contains at least one additive selected from a group consisting of an ultraviolet absorber, a light stabilizer, and a heat-resistant stabilizer. The blending amount of the above-described additives is preferably in a range of 0.005 parts by weight to 5 parts by weight with respect to 100 parts by weight of the crosslinkable resin. Furthermore, it is preferable to contain at least two additives selected from the above-described three additives, and it is particularly preferable to contain all three additives. When the blending amount of the additives is within the above-described range, an effect that improves the resistance against a constant temperature and a constant humidity, the resistance against the heat cycle, weather resistance stability and heat resistance stability is sufficiently ensured, and it is possible to prevent the degradation of the transparency of the encapsulating material for solar cell or the adhesion to a glass plate, the backsheet, the cell, the electrode and aluminum, which is preferable.

Specific examples of the ultraviolet absorber that can be used include benzophenone-based ultraviolet absorbers such as 2-hydroxy-4-normal-octyloxylbenzophenone, 2-hydroxy- 4-methoxybenzophenone, 2,2-dihydroxy-4-methoxybenzophenone, 2-hydroxy-4-methoxy-4-carboxybenzophenone, and 2-hydroxy-4-n-octoxybenzophenone; benzotriazole-based ultraviolet absorbers such as 2-(2-hydroxy-3,5-di-t-butylphenyl)benzotriazole and 2-(2-hydroxy-5-methylpheyl)benzotriazole; salicyclic acid ester-based ultraviolet absorbers such as phenyl salicylate and p-octyl phenyl salicylate.

Examples of the light stabilizer that can be preferably used include hindered amine-based light stabilizers such as bis(2,2,6,6-tetramethyl-4-piperidyl)sebacate, poly[{6-(1,1,3,3-tetramethylbutyl)amino-1,3,5-triazine-2,4-diyl} {(2,2,6,6-tetramethyl-4-piperidyl)imino}hexamethylene{(2,2,6,6-tetramethyl-4-piperidyl)imino}]; hindered pyperidine-based compounds, and the like.

Specific examples of the heat-resistant stabilizer include phosphite-based heat-resistant stabilizer such as tris(2,4-di-tert-butylphenyl)phosphite, bis[2,4-bis(1,1-dimethylethyl)-6-methylphenyl]ethylester photsphite, tetraquis(2,4-di-tert-butylphenyl)[1,1-viphenyl]-4,4'-diylbisphosphite and bis(2,4-di-tert-butylphenyl)pentaerythritol diphosphite; lactone-based heat-resistant stabilizers such as a reaction product of 3-hydroxy-5,7-di-tert-butyl-furan-2-on and o-xylene; hindered phenol-based heat-resistant stabilizers such as 3,3',3",5,5',5"-hexa-tert-butyl-a,a',a"-(methylene-2,4,6-toryl)tri-p-cresole, 1,3,5-trimethyl-2,4,6-tris(3,5-di-tert-butyl-4-hydroxyphenyl)benzylbenzene, pentaerythritol tetraquis[3-(3,5-di-tert-butyl-4-hydroxyphenyl)propionate], octadecyl-3-(3,5-di-tert-butyl-4-hydroxyphenyl)propionate, and thiodiethylene bis[3-(3,5-di-tert-butyl-4-hydroxyphenyl) propionate]; sulfur-based heat-resistant stabilizers; amine-based heat-resistant stabilizers; and the like. In addition, it is possible to use only one of the above-described heat-resistant stabilizers or a combination of two or more heat-resistant stabilizers. Among the above-described heat-resistant stabilizers, the phosphite-based heat-resistant stabilizers and the hindered phenol-based heat-resistant stabilizers are preferred.

(Other Additives)

The resin composition configuring the encapsulating material for solar cell can appropriately contain a variety of components other than the components described above in detail within the scope of the purpose of the invention. For example, other than the ethylene/based copolymer, a variety of polyolefins, styrene-based or ethylene/based block copolymers, propylene-based polymers, and the like can be contained. The content of the above-described components may be in a range of 0.0001 parts by weight to 50 parts by weight, and preferably in a range of 0.001 parts by weight to 40 parts by weight with respect to 100 parts by weight of the crosslinkable resin. In addition, the resin composition can appropriately contain one or more additives selected from a variety of resins other than polyolefins and/or a variety of rubbers, a plasticizer, a filler, a pigment, a dye, an antistatic agent, an antimicrobial agent, an antifungal agent, a flame retardant, a crosslinking aid, a dispersant and the like.

Particularly, in a case in which the crosslinking aid is contained, when the blending amount of the crosslinking aid is in a range of 0.05 parts by weight to 5 parts by weight with respect to 100 parts by weight of the crosslinkable resin, it is possible to provide an appropriate crosslinking structure, and to improve heat resistance, mechanical properties, and adhesiveness, which is preferable.

A well-known crosslinking aid that is ordinarily used for polyolefin-based resins can be used as the crosslinking aid. The crosslinking aid is a compound having two or more double bonds in the molecule. Specific examples thereof include monoacrylates such as t-butyl acrylate, lauryl acrylate, cetyl acrylate, stearyl acrylate, 2-methoxyethyl acrylate, ethylcarbitol acrylate and methoxytripropylene glycol acrylate; monomethacrylates such as t-butyl methacrylate, lauryl methacrylate, cetyl methacrylate, stearyl methacrylate, methoxyethylene glycol methacrylate and methoxypolyethylene glycol methacrylate; diacrylates such as 1,4-butanediol diacrylate, 1,6-hexanediol diacrylate, 1,9-nonanediol diacrylate, neopentyl glycol diacrylate, diethylene glycol diacrylate, tetraethylene glycol diacrylate, polyethylene glycol diacrylate, tripropylene glycol diacrylate and polypropylene glycol diacrylate; dimethacrylates such as 1,3-butanediol dimethacrylate, 1,6-hexanediol dimethacrylate, 1,9-nonanediol dimethacrylate, neopentyl glycol dimethacrylate, ethylene glycol dimethacrylate, diethylene glycol dimethacrylate, triethylene glycol dimethacrylate, and polyethylene glycol dimethacrylate; triacrylates such as trimethylol propane triacrylate, tetramethylol methane triacrylate and pentaerythritol triacrylate; trimethacrylates such as trimethylol propane trimethacrylate and trimethylol ethane trimethacrylate; tetraacrylates such as pentaerythritol tetraacrylate and tetramethylol methane tetraacrylate; divinyl aromatic compounds such as divinyl benzene and di-1-propenyl benzene; cyanurates such as triallyl cyanurate and triallyl isocyanurate; diallyl compounds such as diallyl phthalate; triallyl compounds; oximes such as p-quinone dioxime and p,p'-dibenzoyl quinone dioxime; maleimides such as phenyl maleimide. Among the above-described crosslinking aids, triacrylates such as diacrylate, dimethacrylate, divinyl aromatic compounds, trimethylol propane triacrylate, tetramethylol methane triacrylate and pentaerythritol triacrylate; trimethacrylates such as trimethylol propane trimethacrylate and trimethylol ethane trimethacrylate; tetraacrylates such as pentaerythritol tetraacrylate and tetramethylol methane tetraacrylate; cyanurates such as trially cyanurate and triallyl isocyanurate; diallyl compounds such as diallyl phthalate; triallyl compounds; oximes such as p-quinone dioxime and p,p'-dibenzoyl quinonedioxime; maleimides such as phenyl maleimide are more preferred. Furthermore, among the above-described crosslinking aids, triallyl isocyanurate is particularly preferred since the generation of air bubbles in the encapsulating material for solar cell after lamination is most suppressed and the balance between crosslinking characteristics is excellent.

(Encapsulating Material for Solar Cell)

The encapsulating material for solar cell of the invention is excellent in terms of the suppression of the generation of air bubbles and the prevention of cracking in the solar cell element, and furthermore, is excellent in terms of the balance among the adhesiveness to a variety of solar cell members such as a glass plate, the backsheet, a thin film electrode, aluminum, and a solar cell element, heat resistance, transparency, appearance, weather resistance, volume resistivity, electrical insulating properties, moisture permeability, electrode corrosion properties, extrusion moldability, and crosslinking characteristics. Therefore, the encapsulating material for solar cell of the invention is preferably used as an encapsulating material for solar cell for a well-known solar cell module of the related art.

A preferable embodiment of the encapsulating material for solar cell has a sheet shape as the entire shape. In addition, an encapsulating material for solar cell complexed with other layers including at least one sheet made of the above-described resin composition can also be preferably used. The thickness of the encapsulating material for solar cell layer is generally in a range of 0.01 mm to 2 mm, preferably in a range of 0.05 mm to 1.5 mm, still more preferably in a range of 0.1 mm to 1.2 mm, particularly preferably in a range of 0.2 mm to 1 mm, more preferably in a range of 0.3 mm to 0.9 mm, and most preferably in a range of 0.3 mm to 0.8 mm. When the thickness is within the above-described range, it is possible to suppress the breakage of a glass plate, a solar cell element, a thin film electrode, and the like during the lamination step and to sufficiently ensure light transmittance, thereby obtaining a great light power generation amount. Furthermore, the lamination molding of the solar cell module at a low temperature is possible, which is preferable.

An ordinarily-used method can be used as a method for manufacturing the encapsulating material for solar cell of the invention, but the encapsulating material for solar cell is preferably manufactured through melt blend using a calendar roll, a kneader, a Banbury mixer, an extruder or the like. Particularly, the encapsulating material for solar cell is preferably manufactured using an extruder capable of continuous production.

A method for molding a sheet of the encapsulating material for solar cell is not particularly limited, and a variety of well-known molding methods (cast molding, extrusion sheet molding, inflation molding, injection molding, compression molding, and the like) can be employed. Particularly, a method is preferred in which a resin composition obtained by manually blending the ethylene/based copolymer, the silane coupling agent, the organic peroxide, the ultraviolet absorber, the light stabilizer, the heat-resistant stabilizer, and other additives if necessary in a bag such as a plastic bag or blending them using a kneading and mixing machine such as a Henschel mixer, a tumbler or a super mixer, is injected into an extrusion sheet molding hopper, and extrusion sheet molding is carried out while melting and stirring the mixture, thereby molding a sheet-shaped encapsulating material for solar cell. According to the above-described method, it is possible to improve the adhesiveness and to prevent the deterioration of the light stabilizer so as to improve the long-term reliability such as weather resistance or heat resistance.

The extrusion temperature is preferably in a range of 100° C. to 130° C. When the extrusion temperature is 100° C. or higher, the productivity of the encapsulating material for solar cell can be improved. When the extrusion temperature is 130° C. or lower, gelatinization does not easily occur when the crosslinkable resin composition is made into a sheet using an extruder so as to obtain an encapsulating material for solar cell. Therefore, it is possible to prevent an increase in the torque of the extruder and to facilitate sheet molding. In addition, since the sheet surface does not easily become uneven, it is possible to prevent the degradation of the appearance. In addition, since it is possible to suppress the occurrence of cracking in the sheet when a voltage is applied, a decrease in the dielectric breakdown voltage can be prevented. Furthermore, it is also possible to suppress the moisture permeability. In addition, since the sheet surface does not easily become uneven, the adhesiveness to a glass plate, the cell, the electrode, and the backsheet becomes favorable during the lamination process of the solar cell module, and the adhesiveness is excellent.

As an example of a method for manufacturing the encapsulating material for solar cell of the invention, a case in which the ethylene/based copolymer contains the ethylene/α-olefin copolymer and the ethylene/polar monomer copolymer will be described. It is possible to mix the ethylene/α-olefin copolymer and the ethylene/polar monomer copolymer with additives containing the organic peroxide using a Henschel mixer or a tumbler mixer, and supply the mixture to an extruder, thereby molding the mixture into a sheet shape. It is also possible to separately supply the ethylene/α-olefin copolymer, the ethylene/polar monomer copolymer, and the additives to an extrusion molder, melt and mix the components in the molder. Furthermore, it is also possible to melt and knead the ethylene/α-olefin copolymer and the ethylene/polar monomer copolymer once so as to produce a mixed pellet, and supply the pellet to the extruder again, thereby molding the pellet into a sheet shape.

In addition, the surface of the sheet (or the layer) of the encapsulating material for solar cell may be embossed. When the sheet surface of the encapsulating material for solar cell is decorated through an embossing process, it is possible to prevent the blocking between the encapsulating sheets or between the encapsulating sheet and other sheets. Furthermore, since embosses decreases the storage elastic modulus of the encapsulating material for solar cell, the embosses serve as cushions for the solar cell element and the like during the lamination of the encapsulating material for solar cell and the solar cell element, and the breakage of the solar cell element can be prevented.

The porosity P (%), which is expressed by the percentage ratio $V_H/V_A \times 100$ of the total volume $V_H$ of the concave portions per the unit area of a sheet of the encapsulating material for solar cell to the apparent volume $V_A$ of the sheet of the encapsulating material for solar cell is preferably in a range of 10% to 50%, more preferably in a range of 10% to 40%, and still more preferably in a range of 15% to 40%. Meanwhile, the apparent volume $V_A$ of the sheet of the encapsulating material for solar cell can be obtained by multiplying the unit area by the maximum thickness of the encapsulating material for solar cell.

When the porosity P is equal to or more than 10%, it is possible to sufficiently decrease the elastic modulus of the encapsulating material for solar cell, and therefore it is possible to obtain sufficient cushion properties. Therefore, when the lamination process (pressurization step) is carried out in two phases in a step for manufacturing the module, it is possible to prevent the cracking in a silicon cell or a solder fixing a silicon cell and an electrode in a crystalline solar cell and to prevent the cracking of a silver electrode in a thin film-based solar cell. That is, when the porosity of the encapsulating material for solar cell including the sheet made of the crosslinkable resin composition is equal to or more than 10%, convex portions to which the pressure is added are deformed so as to collapse even in a case in which a pressure is locally added to the encapsulating material for solar cell. Therefore, during the lamination process, for example, even when a large pressure is locally added to the silicon cell or the like, it is possible to prevent the cracking of the silicon cell. In addition, when the porosity of the encapsulating material for solar cell is equal to or more than 10%, an air ventilation path can be ensured, and therefore it is possible to favorably exhaust air during the lamination process. Therefore, it is possible to prevent air from remaining in the solar cell module so as to deteriorate the appearance and to prevent the electrode from being corroded due to moisture in the remaining air when the solar cell module is used for a long period of time. Furthermore, since the number of pores generated in the flowed crosslinkable resin composition is decreased during the lamination, the crosslinkable resin composition does not squeeze out of respective adherends that are attached to the solar cell module so as to prevent the contamination of the laminator.

On the other hand, when the porosity P is equal to or less than 80%, air can be favorably exhausted during the pressurization in the lamination process, and therefore it is possible to prevent air from remaining in the solar cell module. Therefore, the deterioration of the appearance of the solar cell module is prevented, and the electrode is not corroded due to moisture in the remaining air when the solar cell module is used for a long period of time. In addition, since it is possible to favorably exhaust air during the pressurization in the lamination process, the attaching area between the encapsulating material for solar cell and the adherends to be attached increases, and a sufficient adhering strength can be obtained.

The porosity P can be obtained through the following calculation. The apparent volume $V_A$ (mm³) of the embossed encapsulating material for solar cell is computed through the product of the maximum thickness $t_{max}$(mm) and unit area (for example, 1 m² =1000 mm×1000 mm=10⁶ mm²) of the encapsulating material for solar cell as described in the following equation (3).

$$V_A(\text{mm}^3) = t_{max}(\text{mm}) \times 10^6(\text{mm}^2) \quad (3)$$

Meanwhile, the actual volume $V_0$ (mm³) of the unit area of the encapsulating material for solar cell is computed by applying the specific weight $\rho$ (g/mm³) of a resin configuring the encapsulating material for solar cell and the actual weight W (g) of the encapsulating material for solar cell per unit area (1 m²) to the following equation (4).

$$V_0(\text{mm}^3) = W/\rho \quad (4)$$

The total volume $V_H$ (mm³) of the concave portions per the unit area of the encapsulating material for solar cell is computed by subtracting the "actual volume $V_0$" from the "apparent volume $V_A$ of the encapsulating material for solar cell" as described in the following equation (5).

$$V_H(\text{mm}^3) = V_A - V_0 = V_A - (W/\rho) \quad (5)$$

Therefore, the porosity (%) can be obtained in the following manner.

$$\begin{aligned} \text{Porosity } P(\%) &= V_H/V_A \times 100 \\ &= (V_A - (W/\rho))/V_A \times 100 \\ &= 1 - W/(\rho \cdot V_A) \times 100 \\ &= 1 - W/(\rho \cdot t_{max} \cdot 10^6) \times 100 \end{aligned}$$

The porosity (%) can be obtained using the above-described equation, and can also be obtained by photographing a cross-section or embossed surface of an actual encapsulating material for solar cell using a microscope and then processing the image or the like.

The depth of the concave portion formed through the embossing process is preferably in a range of 20% to 95%, more preferably in a range of 50% to 95%, and still more preferably in a range of 65% to 95% of the maximum thickness of the encapsulating material for solar cell. There is a case in which the percentage ratio of the depth D of the concave portion to the maximum thickness $t_{max}$ of the sheet is called the "depth ratio" of the concave portion.

The depth of the concave portion by the embossing process indicates the depth difference D between the top portion of the convex portion and the bottom portion of the concave portion in the uneven surface of the encapsulating material for solar cell formed through the embossing process. In addition, the maximum thickness $t_{max}$ of the encapsulating material for solar cell indicates the distance from the top portion of the convex portion on one surface to the other surface (in the thickness direction of the encapsulating material for solar cell) in a case in which only one surface of the encapsulating material for solar cell is embossed, and indicates the distance from the top portion of the convex portion on one surface to the top portion of the proportion portion on the other surface (in the thickness direction of the encapsulating material for solar cell) in a case in which both surfaces of the encapsulating material for solar cell are embossed.

The embossing process may be carried out on a single surface or on both surfaces of the encapsulating material for solar cell. In a case in which the depth of the concave portion through the embossing process is set to be large, the concave portions are preferably formed only on a single surface of the encapsulating material for solar cell. In a case in which the embossing process is carried out only on a single surface of the encapsulating material for solar cell, the maximum thickness $t_{max}$ of the encapsulating material for solar cell is in a range of 0.01 mm to 2 mm, preferably in a range of 0.05 mm to 1 mm, still more preferably in a range of 0.1 mm to 1 mm, still more preferably in a range of 0.15 mm to 1 mm, still more preferably in a range of 0.2 mm to 1 mm, still more preferably in a range of 0.2 mm to 0.9 mm, still more preferably in a range of 0.3 mm to 0.9 mm, and most preferably in a range of 0.3 mm to 0.8 mm. When the maximum thickness $t_{max}$ of the encapsulating material for solar cell is within the above-described range, it is possible to suppress the breakage of a glass plate, the solar cell element, the thin film electrode and the like in the lamination process, and to laminate-mold the solar cell module at a relative low temperature, which is preferable. In addition, the encapsulating material for solar cell is capable of ensuring a sufficient light transmittance, and the solar cell module for which the above-described encapsulating material for solar cell is used has a high light power generation amount.

Furthermore, a sheet thereof can be used as an encapsulating material for solar cell in a leaflet form that has been cut in accordance with the size of the solar cell module or in a roll form that can be cut in accordance with the size immediately before the solar cell module is produced. The sheet-shaped encapsulating material for solar cell which is a preferable embodiment of the invention needs to have at least one layer made of the encapsulating material for solar cell. Therefore, the number of the layers made of the encapsulating material for solar cell of the invention may be one or multiple. The number of the layers made of the encapsulating material for solar cell of the invention is preferably one since the structure can be simplified so as to decrease the cost, the interface reflection between layers is extremely decreased, and light is effectively used.

The encapsulating material for solar cell may be configured only of layers made of the encapsulating material for solar cell of the invention, or may have layers other than a layer containing the encapsulating material for solar cell (hereinafter, also referred to as "other layers"). The other layers can be classified based on the purposes into, for example, a hard coat layer for protecting the front surface or the back surface, an adhering layer, an antireflection layer, a gas barrier layer, an anti-contamination layer, and the like. The other layers can be classified based on the material into, for example, an ultraviolet-curable resin layer, a thermosetting resin layer, a polyolefin resin layer, a carboxylic acid-modified polyolefin resin layer, a fluorine-containing resin layer, acyclic olefin (co)polymer layer, an inorganic compound layer, and the like.

There is no particular limitation with the positional relationship between the layer made of the encapsulating material for solar cell of the invention and the other layers, and a preferable layer configuration is appropriately selected in consideration of the relationship with the object of the invention. That is, the other layers may be provided between two or more layers made of the encapsulating material for solar cell, may be provided on the outermost layer of the encapsulating material for solar cell, or may be provided at locations other than what has been described above. In addition, the other layers may be provided only on a single surface or on both surfaces of the layer made of the encapsulating material for solar cell. The number of the other layers is not particularly limited, and an arbitrary number of other layers may be provided or no other layer may be provided.

To simplify the structure so as to decrease the cost, extremely decrease the interface reflection, and effectively use light, it is preferable to produce the encapsulating material for solar cell only with a layer made of the encapsulating material for solar cell of the invention without providing the other layers. However, when there are layers necessary or useful in terms of purpose, the other layers may be provided as appropriate. In a case in which the other layers are provided, there is no particular limitation with a method for laminating a layer made of the encapsulating material for solar cell of the invention and the other layers, but a method in which layers are co-extruded using a well-known melt extruder such as a casting molder, an extrusion sheet molder, an inflation molder or an injection molder, thereby obtaining a laminate or a method in which one layer is melted or laminated by heating on the other layer that has been formed in advance, thereby obtaining a laminate is preferred. In addition, the layers may be laminated using a dry laminate method, a heat laminate method or the like in which an appropriate adhesive (for example, a maleic acid anhydride-modified polyolefin resin (product name "ADOMER (registered trademark)" manufactured by Mitsui Chemicals, Inc., "MODIC (registered trademark)" manufactured by Mitsubishi Chemical Corporation or the like), a low (non) crystalline soft polymer such as an unsaturated polyolefin, an acrylic adhesive including an ethylene/acrylic acid ester/maleic acid anhydride-ternary copolymer (trade name "BONDINE (registered trademark)" manufactured by Sumika CdF Chemical Company Limited.), an ethylene/vinyl acetate-based copolymer, an adhesive resin composition containing what has been described above, or the like) is used. An adhesive having heat resistance in a range of approximately 120° C. to 150° C. is preferably used as the adhesive, and preferable examples thereof include polyester-based adhesives, polyurethane-based adhesive, and the like. In addition, to improve the adhesiveness between both surfaces, for example, a silane-based coupling treatment, a titanium-based coupling treatment, a corona treatment, a plasma treatment or the like may be used.

According to the invention, it is possible to provide an encapsulating material for solar cell which has a variety of excellent characteristics such as the suppression of air bubbles, the suppression of PID and the prevention of cracking in the solar cell element.

2. Regarding the Solar Cell Module

An example of the solar cell module is a crystalline solar cell module obtained by, generally, sandwiching a solar cell element formed of polycrystalline silicon or the like using the encapsulating material for solar cell, laminating the solar cell element, and furthermore, covering the front and back surfaces with protective sheets. That is, a typical solar cell module has a configuration of a transparent surface protective member/the encapsulating material for solar cell/the solar cell element/the encapsulating material for solar cell/a back surface protective member. However, the solar cell module which is one of the preferable embodiments of the invention is not limited to the above-described configuration, and some of the above-described layers can be appropriately removed or layers other than the above-described layers can be appropriately provided within the scope of the object of the invention. Examples of layers other than the above-described layers include an adhering layer, a shock absorbing layer, a coating layer, an anti-reflection layer, a back surface re-reflection layer and a light diffusion layer. The above-described layers are not particularly limited, and can be provided at appropriate locations in consideration of the purpose or characteristics of providing the respective layers.

(Crystalline Silicon-Based Solar Cell Module)

FIG. 1 is a cross-sectional view schematically illustrating an embodiment of the solar cell module of the invention. Meanwhile, in FIG. 1, an example of the configuration of a crystalline silicon-based solar cell module 20 is illustrated. As illustrated in FIG. 1, the solar cell module 20 includes a plurality of crystalline silicon-based solar cell elements 22 electrically connected through an interconnector 29 and a pair of a transparent surface protective member 24 and a back surface protective member 26 which sandwich the solar cell elements, and an encapsulating layer 28 is loaded between the protective members and a plurality of the solar cell elements 22. The encapsulating layer 28 is obtained by attaching, heating and pressurizing the encapsulating material for solar cell of the invention, and is in contact with electrodes formed on the light-incident surfaces and back surfaces of the solar cell elements 22. The electrodes refer to collector members respectively formed on the light-incident surfaces and the back surfaces of the solar cell elements 22, and the electrode includes collector lines, tab-type busbars, a back surface electrode layer and the like which will be described below.

Figure 2:
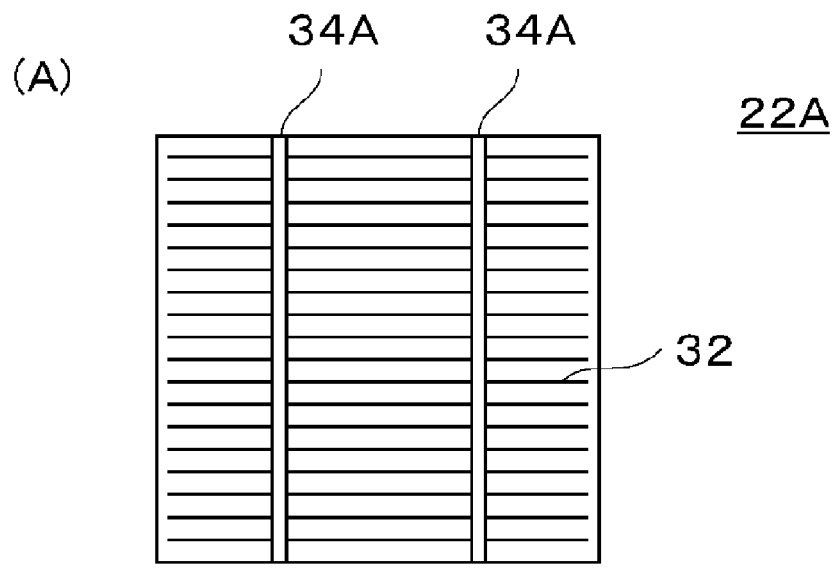
FIG. 2 is a plan view schematically illustrating a configuration example of a light-incident surface and a back surface of a solar cell element.
Figure 2:
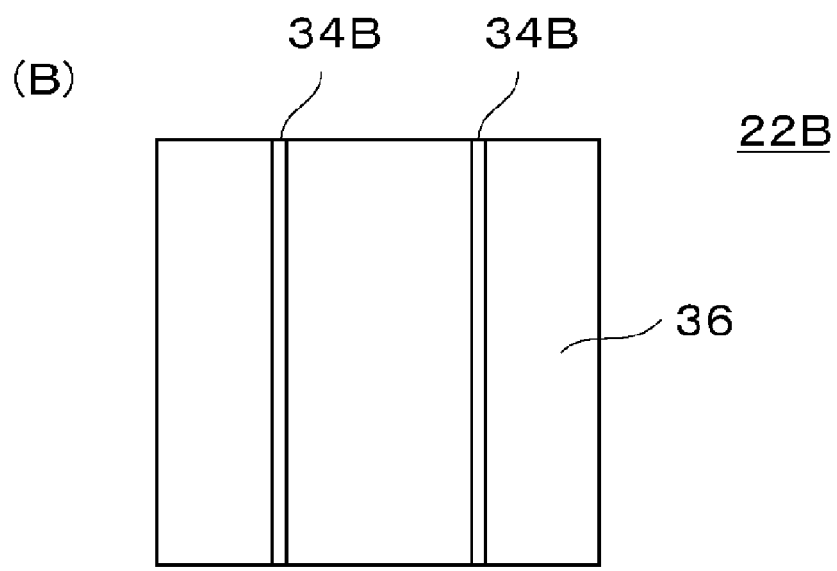

FIG. 2 is a plan view schematically illustrating a configuration example of the light-incident surface and the back surface of the solar cell element. In FIG. 2, examples of the configurations of a light-incident surface 22A and a back surface 22B of the solar cell element 22 are illustrated. As illustrated in FIG. 2(A), a number of linearly-formed collector lines 32 and tab-type busbars (busbars) 34A which collect charges from the collector lines 32 and are connected to the interconnector 29 (FIG. 1) are formed on the light-incident surface 22A of the solar cell element 22. In addition, as illustrated in FIG. 2(B), a conductive layer (back surface electrode) 36 is formed on the entire back surface 22B of the solar cell element 22, and tab-type busbars (busbars) 34B which collect charges from the conductive layer 36 and are connected to the interconnector 29 (FIG. 1) are formed on the conductive layer. The line width of the collection line 32 is, for example, approximately 0.1 mm; the line width of the tab-type busbar 34A is, for example, in a range of approximately 2 mm to 3 mm; and the line width of the tab-type busbar 34B is, for example, in a range of approximately 5 mm to 7 mm. The thicknesses of the collector line 32, the tab-type busbar 34A and the tab-type busbar 34B are, for example, in a range of approximately 20 μm to 50 μm respectively.

The collector line 32, the tab-type busbar 34A and the tab-type busbar 34B preferably contain highly conductive metal. Examples of the highly conductive metal include gold, silver, copper and the like, and silver, a silver compound, a silver-containing alloy and the like are preferred due to the high conduction property and high corrosion resistance. The conductive layer 36 preferably contains not only highly conductive metal but also a highly light-reflecting component, for example, aluminum since light incident on the light-incident surface is reflected so as to improve the photoelectric conversion efficiency of the solar cell element. The collector line 32, the tab-type busbar 34A, the tab-type busbar 34B, and the conductive layer 36 are formed by applying a coating material of a conductive material containing the above-described highly conductive metal to the light-incident surface 22A or the back surface 22B of the solar cell element 22 to a thickness of a coated film of 50 μm through, for example, screen printing, then, drying the coated film, and, if necessary, baking the coated film at a temperature in a range of, for example, 600° C. to 700° C.

The transparent surface protective member 24 is disposed on the light-incident surface side, and is thus required to be transparent. Examples of the transparent surface protective member 24 include a transparent glass plate, a transparent resin film and the like. On the other hand, the back surface protective member 26 is not required to be transparent, and a material for the back surface protective member is not particularly limited. Examples of the back surface protective member 26 include a glass substrate, a plastic film, and the like, and a glass substrate is preferably used from the viewpoint of durability or transparency.

The solar cell module 20 can be obtained using an arbitrary manufacturing method. The solar cell module 20 can be obtained using a step in which a laminate of the back surface protective member 26, the encapsulating material for solar cell, a plurality of the solar cell elements 22, the encapsulating material for solar cell and the transparent surface protective member 24 laminated in this order is obtained; a step in which the laminate is pressurized and attached using a laminator or the like, and is heated at the same time as necessary; and a step in which, after the above-described steps, a heating treatment is further carried out on the laminate as necessary so as to cure the encapsulating material.

Generally, a collection electrode for extracting generated electricity is disposed in the solar cell element. Examples of the collection electrode include a busbar electrode, a finger electrode, and the like. The collection electrode can be disposed on the front and back surfaces of the solar cell element.

In addition, to improve the power generation efficiency, it is possible to use a back contact-type solar cell element which is not required to have the collection electrode disposed on the light-incident surface. In an aspect of the back contact-type solar cell element, p-doped regions and n-doped regions are alternately provided on the back surface side which is provided on the opposite side to the light-incident surface of the solar cell element. In another aspect of the back contact-type solar cell element, a p/n junction is formed in a substrate provided with through holes, a doped layer on the front surface (light-incident surface) side is formed on up to the inner walls of the through holes and the periphery portions of the through holes on the back surface side, and a current on the light-incident surface is extracted on the back surface side.

Generally, in a solar cell system, several or several tens of the above-described solar cell modules are connected in series, and are operated at a voltage in a range of 50 V to 500 V for small-scale residential use, and at a voltage in a range of 600 V to 1000 V for large-scale use called a mega solar power generation system. An aluminum frame is used as the outer frame of the solar cell module for the purpose of maintaining the strength and the like, and an aluminum frame is frequently earthed (grounded) from the viewpoint of safety. As a result, when the solar cell generates power, a voltage difference is generated by power generation between the glass surface having a lower electric resistance compared with the encapsulating material and the solar cell element.

As a result, for the encapsulating material for solar cell that encapsulates the space between a power generation cell and a glass plate or the aluminum frame, there is a demand for favorable electric characteristics such as high electric insulating properties and high resistance.

(Thin Film Silicon-Based (Amorphous Silicon-Based) Solar Cell Module)

The thin film silicon-based solar cell module can be (1) a module in which the transparent surface protective member/a thin film solar cell element/an encapsulating layer/the back surface protective member are laminated in this order; (2) a module in which the transparent surface protective member/the encapsulating layer/the thin film solar cell element/the encapsulating layer/the back surface protective member are laminated in this order; or the like. The transparent surface protective member, the back surface protective member and the encapsulating layer are the same as in the case of the above-described "crystalline silicon-based solar cell module".

The thin film solar cell element in the (1) aspect includes, for example, a transparent electrode layer/a pin-type silicon layer/a back surface electrode layer in this order. Examples of the transparent electrode layer include semiconductor-based oxides such as $In_2O_3$, $SnO_2$, $ZnO$, $Cd_2SnO_4$, and ITO (an oxide obtained by adding Sn to $In_2O_3$). The back surface electrode layer includes, for example, a silver thin film layer. The respective layers are formed using a plasma chemical vapor deposition (CVD) method or a sputtering method. The encapsulating layer is disposed so as to be in contact with the back surface electrode layer (for example, a silver thin film layer). Since the transparent electrode layer is formed on the transparent surface protective member, the encapsulating layer may not be disposed between the transparent surface protective member and the transparent electrode layer.

The thin film solar cell element in the (2) aspect includes, for example, the transparent electrode layer/the pin-type silicon layer/a metal foil or a metal thin film layer (for example, a silver thin film layer) disposed on a heat-resistant macromolecular film in this order. Examples of the metal foil include a stainless steel foil and the like. Examples of the heat-resistant macromolecular film include a polyimide film and the like. The transparent electrode layer and the pin-type silicon layer are, similar to those in the (1) aspect, formed using the CVD method or the sputtering method. That is, the pin-type silicon layer is formed on the metal foil or the metal thin film layer disposed on the heat-resistant macromolecular film; and furthermore, the transparent electrode layer is formed on the pin-type silicon layer. In addition, the metal thin film layer disposed on the heat-resistant macromolecular film is also formed using the CVD method or the sputtering method.

In this case, the encapsulating layer is disposed between the transparent electrode layer and the transparent surface protective member; and between the metal foil or the heat-resistant macromolecular film and the back surface protective member respectively. As described above, the encapsulating layer obtained from the encapsulating material for solar cell is in contact with the collector line, the tab-type busbar, and the electrode such as the conductive layer of the solar cell element. In addition, compared with the crystalline silicon-based solar cell element, since the silicon layer is thinner in the thin film solar cell element in the (2) aspect, the silicon layer is not easily broken due to pressurization during the manufacturing of the solar cell module or the external impact during the operation of the module. Therefore, the flexibility of the encapsulating material for solar cell used for the thin film solar cell module may be lower than that of the encapsulating material for solar cell used for the crystalline silicon-based solar cell module. Meanwhile, since the electrode of the thin film solar cell element is a metal thin film layer as described above, in a case in which the electrode is deteriorated due to corrosion, there is a concern that the power generation efficiency may significantly decrease.

In addition, there is a solar cell module in which silicon is used for the solar cell element as another aspect of the solar cell module. Examples of the solar cell module in which silicon is used for the solar cell element include a hybrid-type (HIT-type) solar cell module in which crystalline silicon and amorphous silicon are laminated, a multi-junction-type (tandem-type) solar cell module in which silicon layers having different absorption wavelength ranges are laminated, a back contact-type solar cell module in which p-doped regions and n-doped regions are alternately provided on the back surface side which is provided on the opposite side to the light-incident surface of the solar cell element, a spherical silicon-type solar cell module in which a number of spherical silicon particles (having a diameter of approximately 1 mm) and a concave mirror (also serving as the electrode) which has a diameter in a range of 2 mm to 3 mm and improves the light-gathering capability are combined together, and the like. In addition, examples of the solar cell module in which silicon is used for the solar cell element include a field-effect-type solar cell module having a structure in which the role of an amorphous silicon-type p-type window layer having the pin junction structure of the related art is provided to the "inversion layer being induced by the field effect" instead of the "insulated transparent electrode", and the like. In addition, examples thereof include a GaAs-based solar cell module in which monocrystalline GaAs is used for the solar cell element; a CIS or CIGS-based (chalcopyrite-based) solar cell module in which a I-III-VI group compound called a chalcopyrite-based compound made of Cu, In, Ga, Al, Se, S or the like is used as the solar cell element instead of silicon; a CdTe—CdS-based solar cell in which a Cd compound thin film is used as the solar cell element, a $Cu_2ZnSnS_4$ (CZTS) solar cell module, and the like. The encapsulating material for solar cell of the invention can be used as an encapsulating material for solar cell for all of the above-described solar cell modules.

Particularly, the encapsulating layer laminated below a photovoltaic element configuring the solar cell module preferably has a high adhesiveness to the encapsulating layer, the electrode, and the back surface protective member laminated on the top portion of the photovoltaic element. In addition, the encapsulating layer preferably has thermal plasticity to maintain the flatness of the back surface of the solar cell element as the photovoltaic element. Furthermore, the encapsulating layer preferably has excellent scratch resistance, shock absorbance and the like to protect the solar cell element as the photovoltaic element.

The encapsulating layer desirably has heat resistance. Particularly, when the solar cell module is manufactured, it is desirable that a resin configuring the encapsulating layer not be modified and deteriorated or decomposed due to the heating action in a lamination method or the like in which the encapsulating layer is suctioned in a vacuum, heated and pressurized or the action of heat such as sunlight during the long-term use of the solar cell module and the like. Then, it is possible to prevent the additives and the like contained in the resin from being eluted or prevent decomposed substances from being generated so as to act on the electromotive force surface (the element surface) of the solar cell element, and to prevent the function and performance from being deteriorated. Furthermore, the encapsulating layer preferably has an excellent moisture-proof property. In this case, it is possible to prevent moisture from being transmitted from the back surface side of the solar cell module, and to prevent the corrosion and deterioration of the photovoltaic element in the solar cell module.

Unlike the encapsulating layer laminated on the photovoltaic element, the above-described encapsulating layer is not essentially required to have transparency. The encapsulating material for solar cell of the invention has the above-described characteristics, and can be preferably used as the encapsulating material for solar cell on the back surface side of the crystalline solar cell module and the encapsulating material for solar cell for the thin film-type solar cell module that is weak against moisture intrusion.

The solar cell module of the invention may appropriately include arbitrary members within the scope of the object of the invention. Typically, it is possible to provide an adhering layer, a shock absorbing layer, a coating layer, an anti-reflection layer, a back surface re-reflection layer, a light diffusion layer and the like. The locations at which the above-described layers are provided are not particularly limited, and the layers can be provided at appropriate locations in consideration of the purpose of the provision of the layers and the characteristics of the layers.

(Transparent Surface Protective Member)

There is no particular limitation with the transparent surface protective member used in the solar cell module, but the transparent surface protective member is located on the outermost surface layer of the solar cell module, and thus preferably has performances for ensuring long-term reliability for the outdoor exposure of the solar cell module including weather resistance, water repellency, contamination resistance, and mechanical strength. In addition, the transparent surface protective member is preferably a sheet having a small optical loss and high transparency for the effective use of sunlight.

Examples of a material for the transparent surface protective member include a resin film made of a polyester resin, a fluorine resin, an acryl resin, a cyclic olefin (co)polymer, an ethylene/vinyl acetate copolymer or the like, a glass substrate, and the like. The resin film is preferably a polyester resin having excellent transparency, strength, cost, and the like, and particularly preferably a polyethylene terephthalate resin, a fluorine resin having favorable weather resistance, or the like. Examples of the fluorine resin include an ethylene/tetrafluoroethylene copolymer (ETFE), a polyvinyl fluoride resin (PVF), a polyvinylidene fluoride resin (PVDF), a polytetrafluoroethylene resin (PTFE), a fluorinated ethylene/propylene copolymer (FEP), and a poly trifluorochloroethylene resin (PCTFE). The polyvinylidene fluoride resin is excellent from the viewpoint of weather resistance, and the ethylene tetrafluoroethylene copolymer is excellent in terms of satisfying both weather resistance and mechanical strength. In addition, to improve the adhesiveness to materials configuring other layers such as an encapsulating material layer, it is desirable to carry out a corona treatment and a plasma treatment on the transparent surface protective member. In addition, it is also possible to use a sheet that has been subjected to a stretching treatment, for example, a biaxially stretched polypropylene sheet to improve the mechanical strength.

In a case in which a glass substrate is used as the transparent surface protective member, the total light transmittance of the glass substrate with respect to light having a wavelength in a range of 350 nm to 1400 nm is preferably equal to or more than 80%, and more preferably equal to or more than 90%. It is usual to use as the glass substrate a super white glass plate that only slightly absorbs the infrared region, but a blue glass plate has a small influence on the output characteristics of the solar cell module when the blue glass plate has a thickness of equal to or less than 3 mm. In addition, it is possible to obtain reinforced glass through a thermal treatment to increase the mechanical strength of the glass substrate, but a float glass plate that has not been subjected to a thermal treatment may be used. In addition, the light-incident surface side of the glass substrate may be coated for antireflection to suppress reflection.

(Back Surface Protective Member)

There is no particular limitation with the back surface protective member used in the solar cell module, but the back surface protective member is located on the outermost surface layer of the solar cell module, and thus, similar to the above-described transparent surface protective member, is required to have a variety of characteristics such as weather resistance and mechanical strength. Therefore, the back surface protective member may be configured of the same material as for the transparent surface protective member. That is, a variety of the above-described materials used as the material for the transparent surface protective member can also be used as a material for the back surface protective member. Particularly, it is possible to preferably use a polyester resin and glass. Since the back surface protective member is not required to allow the penetration of sunlight, transparency required for the transparent surface protective member is not essentially required. Therefore, a reinforcement plate may be attached to increase the mechanical strength of the solar cell module or to prevent strain and warpage caused by the temperature change. Examples of the reinforcement plate that can be preferably used include a steel plate, a plastic plate, a fiberglass reinforced plastic (FRP) plate, and the like.

Furthermore, the encapsulating material for solar cell of the invention may be integrated with the back surface protective member. When the encapsulating material for solar cell and the back surface protective member are integrated together, it is possible to shorten a step for cutting the encapsulating material for solar cell and the back surface protective member to a module size when the module is assembled. In addition, when a step in which the encapsulating material for solar cell and the back surface protective member are separately laid up is replaced by a step in which the encapsulating material for solar cell and the back surface protective member are laid up as an integrated sheet, it is also possible to shorten and remove the lay-up step. In a case in which the encapsulating material for solar cell and the back surface protective member are integrated together, there is no particular limitation with the method for laminating the encapsulating material for solar cell and the back surface protective member. Preferable examples of the lamination method include a method in which the encapsulating material for solar cell and the back surface protective member are co-extruded using a well-known melt extruder such as a casting molder, an extrusion sheet molder, an inflation molder or an injection molder, thereby obtaining a laminate; and a method in which one layer is melted or laminated by heating on the other layer that has been previously molded, thereby obtaining a laminate.

In addition, the encapsulating material for solar cell and the back surface protective member may be laminated using a dry laminate method, a heat laminate method or the like in which an appropriate adhesive (for example, a maleic acid anhydride-modified polyolefin resin (product name "ADOMER (registered trademark)" manufactured by Mitsui Chemicals, Inc., "MODIC (registered trademark)" manufactured by Mitsubishi Chemical Corporation or the like), a low (non) crystalline soft polymer such as an unsaturated polyolefin, an acrylic adhesive including an ethylene/acrylic acid ester/maleic acid anhydride-ternary copolymer (trade name "BONDINE (registered trademark)" manufactured by Sumika CdF Chemical Company Limited.), an ethylene/vinyl acetate-based copolymer, an adhesive resin composition containing what has been described above, or the like) is used.

An adhesive having heat resistance in a range of approximately 120° C. to 150° C. is preferably used as the adhesive, and preferable examples thereof include polyester-based adhesives, and polyurethane-based adhesives. In addition, to improve the adhesiveness between both layers, for example, a silane-based coupling treatment, a titanium-based coupling treatment, a corona treatment, a plasma treatment or the like may be carried out on at least one layer.

(Solar Cell Element)

There is no particular limitation with the solar cell element used in the solar cell module as long as the solar cell element is capable of generating power using a photovoltaic effect of a semiconductor. As the solar cell element, for example, a silicon (monocrystalline silicon, polycrystalline silicon or non-crystalline (amorphous) silicon) solar cell, a compound semiconductor (III-III group, II-VI group, or the like) solar cell, a wet-type solar cell, an organic semiconductor solar cell or the like can be used. Among the above-described solar cells, the polycrystalline silicon solar cell is preferred from the viewpoint of the balance between power generation performance and cost.

Both the silicon solar cell element and the compound semiconductor solar cell element have excellent characteristics as the solar cell element, but it is known that both solar cell elements are easily broken due to external stress, impact and the like. Since the encapsulating material for solar cell of the invention has excellent flexibility, the encapsulating material for solar cell has a great effect of absorbing the stress, impact and the like against the solar cell element so as to prevent the breakage of the solar cell element. Therefore, in the solar cell module of the invention, layers made of the encapsulating material for solar cell of the invention are desirably indirect contact with the solar cell element. In addition, when the encapsulating material for solar cell has thermal plasticity, it is possible to relatively easily remove the solar cell element even after the solar cell module has been produced, and the solar cell element obtains excellent recycling properties. Since the resin composition configuring the encapsulating material for solar cell of the invention has thermal plasticity, the encapsulating material for solar cell also has thermal plasticity as a whole, which is also preferable from the viewpoint of recycling properties.

(Electrode)

There is no particular limitation with the configuration and material of an electrode used in the solar cell module; however, in a specific example, the electrode has a laminate structure of a transparent conductive film and a metal film. The transparent conductive film is made of $SnO_2$, ITO, ZnO or the like. The metal film is made of metal such as silver, gold, copper, tin, aluminum, cadmium, zinc, mercury, chromium, molybdenum, tungsten, nickel or vanadium. The metal film may be solely used or may be used in a form of a complexed alloy. The transparent conductive film and the metal film are formed using a method such as CVD, sputtering or deposition.

(Method for Manufacturing the Solar Cell Module)

A method for manufacturing the solar cell module of the invention includes (i) a step in which the transparent surface protective member, the encapsulating material for solar cell of the invention, the solar cell element (cell), the encapsulating material for solar cell, and the back surface protective member are laminated in this order, thereby forming a laminate, and (ii) a step in which the obtained laminate is pressurized and heated so as to be integrated.

In the step (i), a surface of the encapsulating material for solar cell on which an uneven shape (emboss shape) is formed is preferably disposed to be on the solar cell element side.

In the step (ii), the laminate obtained in the step (i) is heated and pressurized using a vacuum laminator or a hot press according to an ordinary method so as to be integrated (encapsulated). During the encapsulating, since the encapsulating material for solar cell of the invention has a high cushion property, it is possible to prevent the damage of the solar cell element. In addition, since the encapsulating material for solar cell of the invention has favorable deaeration properties, air is not trapped, and it is possible to manufacture high-quality products with a favorable yield.

When the solar cell module is manufactured, the ethylene/α-olefin-based resin composition configuring the encapsulating material for solar cell is cured through crosslinking. In a case in which the encapsulating material for solar cell is crosslinked using a vacuum laminator, for example, the encapsulating material for solar cell is heated in a vacuum for three to six minutes under conditions of a temperature in a range of 125° C. to 160° C. and a vacuum pressure of equal to or less than 300 Pa, and then is pressurized at 100 kPa for approximately 1 to 15 minutes. After that, generally, for example, a crosslinking treatment may be carried out at a temperature in a range of 130° C. to 155° C. for 20 minutes to 60 minutes using a tunnel-type continuous crosslinking furnace or a tray-type batch crosslinking furnace. Alternately, it is also possible to carry out the crosslinking treatment using a vacuum laminator with the heating temperature in the vacuum laminator set in a range of 145° C. to 170° C. and the pressurization time by the atmospheric pressure set in a range of 6 minutes to 30 minutes. Furthermore, after that, the crosslinking treatment may be carried out in the same manner as described above. The crosslinking step may be carried out at the same time as the step (ii) or after the step (ii).

In a case in which the crosslinking step is carried out after the step (ii), the laminate is heated in a vacuum for three to six minutes under conditions of a temperature in a range of 125° C. to 160° C. and a vacuum pressure of equal to or less than 10 Torr (1.33 kPa); and then, pressurization by the atmospheric pressure is carried out for approximately 1 minute to 15 minutes, thereby integrating the laminate. The crosslinking step carried out after the step (ii) can be carried out using an ordinary method, and, for example, a tunnel-type continuous crosslinking furnace may be used, or a tray-type batch crosslinking furnace may be used. In addition, the crosslinking conditions are generally a temperature in a range of 130° C. to 155° C. for approximately 20 minutes to 60 minutes.

Meanwhile, in a case in which the crosslinking step is carried out at the same time as the step (ii), it is possible to carry out the crosslinking step in the same manner as the case in which the crosslinking step is carried out after the step (ii) except for the fact that the heating temperature in the step (ii) is set in a range of 145° C. to 170° C. and the pressurization time by the atmospheric pressure is set in a range of 6 minutes to 30 minutes. Since the encapsulating material for solar cell of the invention contains the specific organic peroxide so as to have excellent crosslinking characteristics, the solar cell module does not need to pass through two phases of an adhering step in the step (ii), is capable of being completed at a high temperature within a short period of time, the crosslinking step carried out after the step (ii) may be removed, and it is possible to significantly improve the productivity of the module.

In any case, the solar cell module of the invention may be manufactured by temporarily adhering the encapsulating material for solar cell to the solar cell element or a protection material at a temperature at which a crosslinking agent is not substantially decomposed and the encapsulating material for solar cell of the invention is melted, and then increasing the temperature, thereby carrying out sufficient adhering and the crosslinking of the encapsulating material. An additive prescription with which a variety of conditions can be satisfied may be selected, and, for example, the type and impregnation amount of the above-described crosslinking agent and the above-described crosslinking aid may be selected.

In addition, the above-described crosslinking is preferably carried out until the gel fraction of the crosslinked ethylene/α-olefin copolymer becomes 50% to 95%. The gel fraction is more preferably in a range of 50% to 90%, still more preferably in a range of 60% to 90%, and most preferably in a range of 65% to 90%. The gel fraction can be computed using the following method. For example, 1 g of a sample of an encapsulating material sheet is sampled from the solar cell module, and Soxhlet extraction is carried out for ten hours in boiling toluene. An extraction liquid is filtered using a stainless steel mesh having 30 meshes, and the mesh is depressurized and dried at 110° C. for eight hours. The weight of a residue remaining on the mesh is measured, and the ratio of the weight of the residue remaining on the mash to the sample amount (1 g) before the treatment is considered as the gel fraction.

When the gel fraction is equal to or more than the above-described lower limit value, the heat resistance of the encapsulating material for solar cell becomes favorable, and it is possible to suppress the degradation of the adhesiveness in, for example, a constant temperature and humidity test at 85° C.×85% RH, a high-strength xenon radiation test at a black panel temperature of 83° C., a heat cycle test at a temperature in a range of −40° C. to 90° C., and a heat resistance test. On the other hand, when the gel fraction is equal to or less than the above-described upper limit value, the encapsulating material for solar cell obtains high flexibility, and the temperature followability in the heat cycle test at a temperature in a range of −40° C. to 90° C. improves, and therefore it is possible to prevent the occurrence of peeling.

An encapsulating film obtained by removing members other than the encapsulating layer from the solar cell module manufactured in the above-described manner has the following characteristics A) and B).

A) The acetone-absorbing ratio is in a range of 3.5 weight % to 12.0 weight % with respect to the weight of the encapsulating film when the encapsulating film is immersed in acetone at 23° C. for one hour.

B) The volume resistivity of the encapsulating film, which is based on JIS K6911 and measured at a temperature of 100° C. with an applied voltage of 500 V, is in a range of $1.0 \times 10^{13}$ Ω·cm to $1.0 \times 10^{18}$ Ω·cm.

In addition, the encapsulating film preferably further satisfies the following C) and D).

C) The shore A hardness of the encapsulating film, which is measured on the basis of ASTM D2240, is in a range of 50 to 85.

D) The t-butyl alcohol-absorbing ratio is in a range of 2.5 weight % to 6.0 weight % with respect to the weight of the encapsulating film when the encapsulating film is immersed in t-butyl alcohol at 30° C. for one hour.

The characteristics A) to D) can be measured in the same manner as the method described in 1) to 4) except for the fact that the crosslinking treatment is not carried out in the methods described in 1) to 4).

(Power Generation Facility)

The solar cell module of the invention is excellent in terms of productivity, power generation efficiency, service life, and the like. Therefore, a power generation facility using the above-described solar cell module is excellent in terms of cost, power generation efficiency, service life, and the like, and has a high practical value. The above-described power generation facility is preferable for long-term indoor and outdoor use so as to be used as an outdoor mobile power supply for camping and the like, which is installed outside houses, or to be used as an auxiliary power supply for automobile batteries.

According to the solar cell module, since the encapsulating layer formed by crosslinking the encapsulating material for solar cell of the invention is provided, even when the temperature increases during the use of the solar cell module, it is possible to avoid a trouble such as the deformation of the encapsulating layer so that the appearance of the solar cell is not impaired, and the economic aspect such as cost is excellent. In addition, according to the solar cell module, since the encapsulating layer formed by crosslinking the encapsulating material for solar cell of the invention is provided and when the solar cell module is put into a solar cell array, it is possible to significantly suppress the occurrence of PID even when a state in which a high voltage is applied between the frame and the solar cell element is maintained.

Thus far, the embodiments of the invention have been described with reference to the accompanying drawings, but the embodiments are simply examples of the invention, and the invention is still capable of employing a variety of configurations other than the above-described configuration.

EXAMPLES

Hereinafter, the invention will be specifically described based on examples, but the invention is not limited to the examples.

(1) Measurement Method

[The Content Ratio of the Ethylene Unit, α-Olefin and the Vinyl Acetate Unit]

After a solution obtained by heating and melting 0.35 g of a specimen in 2.0 ml of hexachlorobutadiene was filtered using a glass filter (G2), 0.5 ml of deuterated benzene was added, and the mixture was injected into an NMR tube having an inner diameter of 10 mm. The $^{13}$C-NMR was measured at 120° C. using a JNM GX-400-type NMR measurement device manufactured by JEOL, Ltd. The cumulated number was set to equal to or more than 8000 times. The content ratio of the ethylene unit, the content ratios of α-olefin and the vinyl acetate unit in the copolymer were determined from the obtained $^{13}$C-NMR spectra.

[MFR]

MFRs of the ethylene/α-olefin copolymer and the ethylene/vinyl acetate copolymer were measured on the basis of ASTM D1238 under conditions of 190° C. and a load of 2.16 kg. In addition, regarding MFR of the crosslinkable resin, a mixture of the ethylene/α-olefin copolymer and the ethylene/vinyl acetate copolymer was melted and kneaded at a dice temperature of 200° C. using a single screw extruder so as to produce a pellet, and MFR was measured in the same manner using the pellet.

[The Acetone and t-Butyl Alcohol-Absorbing Ratios]

After a sheet of the obtained encapsulating material for solar cell was cut into a size of 10 cm×10 cm, the sheet was laminated using a lamination apparatus (LM-110×160S manufactured by NPC Corporation) under conditions of 150° C., a vacuum pressure of 250 Pa for three minutes and a pressurization pressure of 100 kPa for 15 minutes, thereby producing a 0.5 mm-thick crosslinked sheet for measurement. The obtained crosslinking-treated sheet was cut so as to be capable of being put into a closed container, and approximately 1 g of the sheet was weighed using a precision scale. After the weighing, the sheet was put into the 100 ml closed container filled with 10 ml of acetone, and was immersed at 23° C. for one hour. After one hour, acetone attached to the sheet surface was wiped away using KIMWIPE or the like, and the sheet after the test was weighed using the precision scale. The acetone-absorbing ratio was computed from the difference in weight before and after the test. Regarding the t-butyl alcohol as well, the t-butyl alcohol-absorbing ratio was computed in the same manner except for the fact that the temperature condition was changed to 30° C.

[Shore A Hardness]

After a sheet of the obtained encapsulating material for solar cell was cut into a size of 10 cm×10 cm, six pieces of the sheet were overlaid and laminated using a lamination apparatus (LM-110×160S manufactured by NPC Corporation) under conditions of 150° C., a vacuum pressure of 250 Pa for three minutes and a pressurization pressure of 100 kPa for 15 minutes, thereby producing a 3 mm-thick crosslinked sheet for measurement. The shore A hardness of the cross linking-treated encapsulating material for solar cell was measured on the basis of ASTM D2240 using the obtained sheet.

[the Content of an Aluminum Element]

After the ethylene/α-olefin copolymer was wet-decomposed, the volume was made to be constant using pure water, the amount of aluminum was determined using an ICP emission spectrometer (ICPS-8100 manufactured by Shimadzu Corporation), and the content of an aluminum element was obtained.

[The Shore A Hardness of the Ethylene/α-Olefin Copolymer]

After the ethylene/α-olefin copolymer was heated at 190° C. for four minutes and pressurized at 10 MPa, the ethylene/α-olefin copolymer was pressurized and cooled at 10 MPa to room temperature for five minutes, thereby obtaining a 3 mm-thick sheet. The shore A hardness of the ethylene/α-olefin copolymer was measured on the basis of ASTM D2240 using the obtained sheet.

[Density]

The density of the ethylene/α-olefin copolymer was measured on the basis of ASTM D1505.

[B Value]

The B value of the ethylene/α-olefin copolymer was computed from the above-described $^{13}$C-NMR spectrum according to the following equation (1).

$$B \text{ value} = [P_{OE}]/(2 \times [P_O] \times [P_E]) \tag{1}$$

(In the equation (1), $[P_E]$ represents the proportion (molar fraction) of the structural unit derived from ethylene in the ethylene/α-olefin copolymer, $[P_O]$ represents the proportion (molar fraction) of the structural unit derived from an α-olefin having 3 to 20 carbon atoms in the ethylene/α-olefin copolymer, and $[P_{OE}]$ represents the proportion (molar fraction) of α-olefin-ethylene chain in total dyad chain.)

[Tαβ/Tαα]

The "Tαβ/Tαα" of the ethylene/α-olefin copolymer was computed from the above-described $^{13}$C-NMR spectrum with reference to the description of the above-described documents.

[Molecular Weight Distribution Mw/Mn]

The molecular weight distribution (Mw/Mn) was measured in the following manner using a gel permeation chromatography manufactured by Waters (trade name: "ALLIANCE GPC-2000"). Two TSKgel GMH6-HT (trade name)

columns and two TSKgel GMH6-HTL (trade name) columns were used as separation columns. Regarding the column size, an inner diameter of 7.5 mm and a length of 300 mm were provided to all columns, the column temperature was set to 140° C., o-dichlorobenzene (manufactured by Wako Pure Chemical Industries, Ltd.) was used as a mobile phase, and 0.025 weight % of BHT (manufactured by Takeda Pharmaceutical Company Limited) was used as an antioxidant. The mobile phase was moved at a rate of 1.0 ml/minute so as to set the specimen concentration to 15 mg/10 ml, the specimen injection amount was set to 500 μl, and a differential refractometer was used as a detector. Polystyrene manufactured by Tosoh Corporation was used as the standard polystyrene for the ethylene/α-olefin copolymer having a molecular weight satisfying Mw≤1000 and Mw≥4×10$^6$, and polystyrene manufactured by Pressure Chemical Corporation was used as the standard polystyrene for the ethylene/α-olefin copolymer having a molecular weight satisfying 1000≤Mw≤4×10$^6$. The molecular weight was the value of the ethylene/α-olefin copolymer converted in accordance with each of the used α-olefins through universal correction.

[The Content Ratio of Chlorine Ions]

The content ratio of chlorine ions was measured using an extraction liquid, which was obtained by precisely weighing approximately 10 g of the ethylene/α-olefin copolymer in a glass container that had been sterilized and washed using an autoclave or the like, adding 100 ml of ultrapure water, closely encapsulating the glass container, and then carrying out ultrasonic wave (38 kHz) extraction at room temperature for 30 minutes, and an ion chromatography device manufactured by Dionex Ltd. (trade name "ICS-2000").

[The Extraction Amount into Methyl Acetate]

The extraction amount into methyl acetate was computed by precisely weighing approximately 10 g of the ethylene/α-olefin copolymer, carrying out Soxhlet extraction at a warm water bath temperature of 90° C. using methyl acetate for three hours, and using the difference in the weight of the ethylene/α-olefin copolymer before and after the extrusion or the residue amount obtained after the extracted solvent is volatilized.

[Volume Resistivity]

After a sheet of the obtained encapsulating material for solar cell was cut into a size of 10 cm×10 cm, the sheet was laminated using a lamination apparatus (LM-110×160S manufactured by NPC Corporation) under conditions of 150° C., a vacuum pressure of 250 Pa for three minutes and a pressurization pressure of 100 kPa for 15 minutes, thereby producing a crosslinked sheet for measurement. The volume resistivity (Ω·cm) of the produced crosslinked sheet was measured at an applied voltage of 500 V on the basis of JIS K6911. Meanwhile, during the measurement, the temperature was set to 100±2° C. using a high-temperature measurement chamber "12708" (manufactured by Advantest Corporation), and a microammeter "R8340A" (manufactured by Advantest Corporation) was used.

[Air Bubble]

A sheet sample was placed on a blue glass plate (3 mm-thick, 12 cm×7.5 cm), then, two 0.2 mm-thick 3 cm×3 cm aluminum plates were placed on the blue glass plate at intervals of 2 cm, and were fixed using a polytetrafluoroethylene/based adhesion tape having a width of 1 cm and a length of 3 cm. Next, another sheet sample was further placed on the aluminum plates, finally, a PET-based backsheet was overlaid, was attached using a lamination apparatus (LM-110×160S manufactured by NPC Corporation) under conditions of 150° C., a vacuum pressure of 250 Pa for three minutes and a pressurization pressure of 100 kPa for 15 minutes, and then the appearance of the crosslinked and adhered sheet sample was observed (initial swollenness). Furthermore, the sheet sample was put into an oven at 130° C., and the appearance was observed after a heat resistance test was carried out for one hour (swollenness after the heat resistance test). The generation of air bubbles was evaluated according to the following criteria.

A: There was no particular change in the appearance.

B: The shape slightly changed at places where the adhesion tape was attached.

C: The sheet sample was swollen at places where the adhesion tape was attached.

[Cracking in the Solar Cell Element]

A 150 μm-thick silicon-type solar cell element was cut and sampled from an ingot, and a super white glass plate/a sheet sample/the silicon-type solar cell element/a sheet sample/a PET backsheet were attached together using a lamination apparatus (LM-110×160S manufactured by NPC Corporation) under conditions of 150° C., a vacuum pressure of 250 Pa for three minutes and a pressurization pressure of 100 kPa for 15 minutes, thereby obtaining a laminate. The silicon-type solar cell element in the obtained laminate was visually observed, and cracking was evaluated.

[PID Evaluation]

A small module in which 18 cells were connected in series using a monocrystalline silicon solar cell element was produced and evaluated. A 3.2 mm-thick embossed and thermally-treated glass plate obtained by cutting a white float glass plate manufactured by AGC Fabritech Co., Ltd. into a size of 24 cm×21 cm was used as a glass plate for the module. A monocrystalline silicon solar cell element (manufactured by Shinsung Solar Energy Co., Ltd.) was used after a busbar silver electrode on the light-incident surface side was placed in the center and the solar cell element was cut into a size of 5 cm×3 cm. Eighteen cells were connected in series using a copper ribbon electrode obtained by coating the surface of a copper foil with eutectic solder. A PET-based backsheet including a silica film-deposited PET sheet was used as the backsheet. An approximately 2 cm-long cut was made in a part of the backsheet using a cutter knife, and was used as a terminal extraction portion from the cell. A positive terminal and a negative terminal were extracted from the 18 cells connected in series. The components were laminated using a lamination apparatus (LM-110×160S manufactured by NPC Corporation) under conditions of 150° C., a vacuum pressure of 250 Pa for three minutes and a pressurization pressure of 100 kPa for 15 minutes, thereby obtaining a laminate. After that, the encapsulating material protruding from the glass plate and the backsheet were cut, and an end surface encapsulating material was supplied to the glass plate edge, thereby attaching an aluminum frame. After that, RTV silicone was supplied and cured at the extraction portions of the backsheet.

The positive terminal and the negative terminal in the mini module were short-circuited, and a high voltage-side cable of a power supply was connected. In addition, a low voltage-side cable of the power supply was connected to the aluminum frame, and the aluminum frame was earthed. The module was set in a constant temperature and humidity tank at 85° C. and 85% rh, the temperature was increased, and then maintained under the application of −600 V.

A HARb-3R10-LF (manufactured by Matsusada Precision Inc.) was used as a high-voltage power supply; and a FS-214C2 (manufactured by Etac Engineering Co., Ltd.) was used as the constant temperature and humidity tank.

After 24 hours of a constant temperature and humidity test, the IV characteristics of the module were evaluated using a xenon light source having a light intensity distribution of an air mass (AM) 1.5 class A. A PVS-116i-S manufactured by Nisshinbo Mechatronics Inc. was used in the IV evaluation. The evaluation results were classified as described below.

Based on the initial value, when a decrease in the maximum output power $P_{max}$ of the IV characteristics after the test was equal to or less than 1%: A
1% to less than 5%: B
more than 5%: C

(2) The Synthesis of the Ethylene/α-Olefin Copolymer

Synthesis Example 1

A toluene solution of methyl aluminoxane was supplied as a co-catalyst at a rate of 8.0 mmol/hr, a hexane slurry of bis(1,3-dimethylcyclopentadienyl) zirconium dichloride and a hexane solution of triisobutylaluminum were supplied at rates of 0.025 mmol/hr and at 0.5 mmol/hr respectively as main catalysts to one supply opening of a continuous polymerization vessel having stirring blades and an inner volume of 50 L, and normal hexane which was used as a catalyst solution and a polymerization solvent was continuously supplied and was dehydrated and purified so that the total of the dehydrated and purified normal hexane became 20 L/hr. At the same time, ethylene, 1-butene and hydrogen were continuously supplied at rates of 3 kg/hr, 15 kg/hr and 5 NL/hr respectively to another supply opening of the polymerization vessel, and continuous solution polymerization was carried out under conditions of a polymerization temperature of 90° C., a total pressure of 3 MPaG, and a retention time of 1.0 hour. The normal hexane/toluene solution mixture of the ethylene/α-olefin copolymer generated in the polymerization vessel was continuously exhausted through an exhaust opening provided in the bottom portion of the polymerization vessel, and was guided to a coupling pipe in which a jacket portion was heated using 3 kg/cm² to 25 kg/cm² steam so that the normal hexane/toluene solution mixture of the ethylene/α-olefin copolymer reached a temperature in a range of 150° C. to 190° C. Meanwhile, a supply opening through which methanol that was a catalyst-devitalizing agent was injected was provided immediately before the coupling pipe, and methanol was injected at a rate of approximately 0.75 L/hr so as to combine with the normal hexane/toluene solution mixture of the ethylene/α-olefin copolymer. The normal hexane/toluene solution mixture of the ethylene/α-olefin copolymer maintained at approximately 190° C. in the steam jacket-equipped coupling pipe was continuously sent to a flash chamber by adjusting the degree of the opening of a pressure control valve provided at the terminal portion of the coupling pipe so as to maintain approximately 4.3 MPaG. Meanwhile, when the normal hexane/toluene solution mixture was sent to the flash chamber, the solution temperature and the degree of the opening of the pressure-adjusting valve were set so that the pressure in the flash chamber was maintained at approximately 0.1 MPaG and the temperature of a vapor portion in the flash chamber was maintained at 180° C. After that, a strand was cooled in a water vessel after passing a single screw extruder in which the die temperature was set to 180° C., and the strand was cut using a pellet cutter, thereby obtaining an ethylene/α-olefin copolymer in a pellet form. The yield was 2.2 kg/hr. The properties are described in Table 1.

Synthesis Example 2

An ethylene/α-olefin copolymer was obtained in the same manner as in Synthesis Example 1 except for the fact that a hexane solution of [dimethyl(t-butylamide) (tetramethyl-η5-cyclopentadienyl) silane]titandichloride was supplied as a main catalyst at a rate of 0.012 mmol/hr, a toluene solution of triphenylcarbenium (tetrakis-pentafluorophenyl) borate and a hexane solution of triisobutylaluminum were supplied at rates of 0.05 mmol/hr and 0.4 mmol/hr respectively as co-catalysts, and 1-butene and hydrogen were supplied at rates of 5 kg/hr and 100 NL/hr respectively. The yield was 1.3 kg/hr. The properties are described in Table 1.

Synthesis Example 3

An ethylene/α-olefin copolymer was obtained in the same manner as in Synthesis Example 1 except for the fact that a hexane solution of bis(p-tolyl)methylene(cyclopentadienyl) (1,1,4,4,7,7,10,10-octamethyl-1,2,3,4,7,8,9,10-octahydrodibenzo(b,h)-fluorenyl)zirconium dichloride was supplied as a main catalyst at a rate of 0.003 mmol/hr; a toluene solution of methyl aluminoxane and a hexane solution of triisobutylaluminum were supplied at rates of 3.0 mmol/hr and 0.6 mmol/hr respectively as co-catalysts; ethylene was supplied at a rate of 4.3 kg/hr; 1-octene was supplied instead of 1-butene at a rate of 6.4 kg/hr; dehydrated and purified normal hexane was continuously supplied so that the total of 1-octane and the dehydrated and purified normal hexane which was used as a catalyst solution and a polymerization solvent became 20 L/hr; hydrogen was supplied at a rate of 60 NL/hr; and the polymerization temperature was set to 130° C. The yield was 4.3 kg/hr. The properties are described in Table 1.

TABLE 1

|  | Synthesis Example 1 | Synthesis Example 2 | Synthesis Example 3 |
|---|---|---|---|
| α-olefin type | 1-butene | 1-butene | 1-octene |
| Content ratio of α-olefin unit [mol %] | 14 | 17 | 11 |
| Content ratio of ethylene unit [mol %] | 86 | 83 | 89 |
| MFR [g/10 minutes] | 20 | 11 | 48 |
| Al residue amount [ppm] | 102 | 8 | 23 |
| Density [g/cm³] | 0.870 | 0.866 | 0.884 |
| Shore A hardness [—] | 70 | 62 | 84 |
| B value [—] | 1.11 | 1.07 | 1.16 |
| Tαβ/Tαα [—] | <0.01 | 0.4 | <0.01 |
| Mw/Mn [—] | 2.2 | 2.2 | 2.1 |
| Content ratio of chlorine ions [ppm] | 1 | 0.4 | 0.1 |
| Extraction amount of methyl acetate [weight %] | 0.7 | 1.8 | 0.8 |

(Ethylene/Polar Monomer Copolymer)

The ethylene/polar monomer copolymers described in Table 2 were used. In Table 2, E represents ethylene, VA represents vinyl acetate, and GMA represents glycidyl methacrylate. LOTADERR AX8900 manufactured by ARKEMA Inc. was used as E•GMA.

TABLE 2

|  | EVA1 | EVA2 | E•GMA |
|---|---|---|---|
| Polar monomer type | VA | VA | GMA |
| Content ratio of polar monomer unit [weight %] | 28 | 33 | 32 |
| MFR [g/10 minutes] | 15 | 30 | 6 |

(3) Manufacturing of the Encapsulating Material for Solar Cell (Sheet)

Example 1

0.5 parts by weight of 3-methacryloxypropyltrimethoxy silane as the silane coupling agent, 0.7 parts by weight of t-butylperoxy-2-ethylhexyl carbonate having a one-minute half-life temperature of 166° C. as the organic peroxide, 1.2

Examples 2 to 7 and Comparative Examples 1 and 2

Embossed sheets (sheets of the encapsulating material for solar cell) were obtained in the same manner as in Example 1 except for the fact that the components were blended as described in Table 3. The porosities of the obtained sheets were all 28%. A variety of evaluation results of the obtained sheets are described in Table 3.

TABLE 3

| | | | Example 1 | Example 2 | Example 3 | Example 4 | Example 5 | Example 6 | Example 7 | Comparative Example 1 | Comparative Example 2 |
|---|---|---|---|---|---|---|---|---|---|---|---|
| Blending (parts by weight) | Ethylene/α-olefin copolymer | Synthesis Example 1 | 95 | | | 65 | | 75 | 80 | 100 | 35 |
| | | Synthesis Example 2 | | 75 | | | 99 | | | | |
| | | Synthesis Example 3 | | | 50 | | | | | | |
| | Ethylene/polar monomer copolymer | EVA-1 | 5 | 25 | 50 | | 1 | | 20 | | 65 |
| | | EVA-2 | | | | 35 | | | | | |
| | | E · GMA | | | | | | 25 | | | |
| | Silane coupling agent | | 0.5 | 0.5 | 0.5 | 0.5 | 0.5 | 0.5 | 0.5 | 0.5 | 0.5 |
| | Organic peroxide | | 0.7 | 0.7 | 0.7 | 0.7 | 0.7 | 0.7 | 0.7 | 0.7 | 0.7 |
| | Crosslinking aid | | 1.2 | 1.2 | 1.2 | 1.2 | 1.2 | 1.2 | 1.2 | 1.2 | 1.2 |
| | Ultrasonic absorbent | | 0.4 | 0.4 | 0.4 | 0.4 | 0.4 | 0.4 | 0.4 | 0.4 | 0.4 |
| | Hindered amine-based light stabilizer | | 0.2 | 0.2 | 0.2 | 0.2 | 0.2 | 0.2 | 0.2 | 0.2 | 0.2 |
| | Heat-resistant stabilizer 1 | | 0.1 | 0.1 | 0.1 | 0.1 | 0.1 | 0.1 | 0.1 | 0.1 | 0.1 |
| | Heat-resistant stabilizer 2 | | 0.1 | 0.1 | 0.1 | 0.1 | 0.1 | 0.1 | 0.1 | 0.1 | 0.1 |
| Volume resistivity at 100° C. [Ω · cm] | | | $8.1 \times 10^{14}$ | $2.1 \times 10^{13}$ | $1.9 \times 10^{13}$ | $3.0 \times 10^{13}$ | $1.6 \times 10^{15}$ | $2.1 \times 10^{14}$ | $5.1 \times 10^{14}$ | $2.1 \times 10^{15}$ | $4.5 \times 10^{12}$ |
| Acetone-absorbing amount [weight %] | | | 4.5 | 7.9 | 10.9 | 8.3 | 3.7 | 11.2 | 11.2 | 3.2 | 13.9 |
| t-butyl alcohol-absorbing amount [weight %] | | | 3.1 | 4.5 | 5.6 | 5.1 | 2.6 | 5.9 | 5.9 | 2.3 | 7.3 |
| Shore A hardness [—] | | | 66 | 67 | 83 | 58 | 65 | 81 | 81 | 64 | 80 |
| MFR of crosslinkable resin [g/10 minutes] | | | 20 | 12 | 27 | 23 | 11 | 17 | 17 | 20 | 17 |
| Evaluation | Air bubble | Initial swollenness | A | A | A | A | B | A | A | B | A |
| | | Swollenness after one hour at 130° C. | A | A | A | A | B | A | A | C | A |
| | Cell cracking | | No change | No change | No change | No change | No change | No change | No change | No change | No change |
| | PID evaluation | | A | A | A | A | A | A | A | A | C | parts by weight of triallyl isocyanurate as the crosslinking aid, 0.4 parts by weight of 2-hydroxy-4-normal-octyloxybenzophenone as the ultraviolet absorber, 0.2 parts by weight of bis(2,2,6,6-tetramethyl-4-piperidyl)sebacate as the hindered amine-based light stabilizer, 0.1 parts by weight of tris(2,4-di-tert-butylphenyl)phosphite as the heat-resistant stabilizer 1, and 0.1 parts by weight of octadecyl-3-(3,5-di-tert-butyl-4-hydroxyphenyl)propionate as the heat-resistant stabilizer 2 were blended with 95 parts by weight of the ethylene/α-olefin copolymer and 5 parts by weight of the ethylene/vinyl acetate copolymer (EVA-1) of Synthetic Example 1 (the total of the ethylene/α-olefin copolymer and the ethylene/vinyl acetate copolymer is 100 parts by weight).

A coat hanger T die (with a lip shape: 270 mm×0.8 mm) was mounted in a single screw extruder (with a screw diameter of 20 mmϕ, L/D=28) manufactured by Thermoplastic Company, and molding was carried out at a roll temperature of 30° C. and a winding rate of 1.0 m/min under a condition of a die temperature of 100° C. using an embossing roll as a cooling roll, thereby obtaining an embossed sheet (a sheet of the encapsulating material for solar cell) having a maximum thickness of 0.5 mm. The porosity of the obtained sheet was 28%. A variety of evaluation results of the obtained sheet are described in Table 3.

In the solar cell modules for which the sheets of the encapsulating material for solar cell of Examples 1 to 7 were used, it was shown that the occurrence of the PID phenomenon and the generation of air bubbles could be suppressed. In addition, as a result of a constant temperature and humidity test of the solar cell module for which the sheet of the encapsulating material for solar cell of the example was used at 85° C. and 85% rh, it was confirmed that it was possible to suppress the occurrence of the PID phenomenon for a longer period of time in the sheets of the encapsulating material for solar cell of Examples 1 and 5.

The present application claims priority based on Japanese Patent Application No. 2012-000809 filed on Jan. 5, 2012, the contents of which are incorporated herein by reference.

The invention claimed is:

1. An encapsulating material for solar cell made of a resin composition containing a crosslinkable resin and satisfying the following 1) and 2):
   1) when the encapsulating material for solar cell is immersed in acetone at 23° C. for one hour after a crosslinking treatment in which the encapsulating material for solar cell is heated and depressurized at 150° C. and 250 Pa for three minutes, and then is heated and pressurized at 150° C. and 100 kPa for 15 minutes, an acetone-absorbing ratio is in a range of 3.5 weight % to 12.0 weight % with respect to a weight of the crosslinking-treated encapsulating material for solar cell, and 2) a volume resistivity of the crosslinking-treated encapsulating material for solar cell, which is based on JIS K6911 and measured at a temperature of 100° C. with an applied voltage of 500 V, is in a range of $1.0 \times 10^{13}$ Ω·cm to $1.0 \times 10^{18}$ Ω·cm, wherein the crosslinkable resin contains an ethylene/α-olefin copolymer and an ethylene/polar monomer copolymer, a content of the ethylene/α-olefin copolymer in the crosslinkable resin is in a range of 50 parts by weight to 99 parts by weight with respect to 100 parts by weight of the crosslinkable resin, and a content of the ethylene/polar monomer copolymer in the crosslinkable resin is in a range of 1 part by weight to 50 parts by weight with respect to 100 parts by weight of the crosslinkable resin.

2. The encapsulating material for solar cell according to claim 1, further satisfying the following 3):

3) a shore A hardness of the crosslinking-treated encapsulating material for solar cell, which is measured on the basis of ASTM D2240, is in a range of 50 to 85.

3. The encapsulating material for solar cell according to claim 1, further satisfying the following 4):

4) when the crosslinking-treated encapsulating material for solar cell is immersed in t-butyl alcohol at 30° C. for one hour, a t-butyl alcohol-absorbing ratio is in a range of 2.5 weight % to 6.0 weight % with respect to the weight of the crosslinking-treated encapsulating material for solar cell.

4. The encapsulating material for solar cell according to claim 1, wherein MFR of the crosslinkable resin, which is based on ASTM D1238 and measured under conditions of 190° C. and a load of 2.16 kg, is in a range of 10 g/10 minutes to 50 g/10 minutes.

5. The encapsulating material for solar cell according to claim 1, wherein a content ratio of a structural unit derived from ethylene is in a range of 80 mol % to 90 mol %, and a content ratio of a structural unit derived from an α-olefin having 3 to 20 carbon atoms is in a range of 10 mol % to 20 mol % in the ethylene/α-olefin copolymer.

6. The encapsulating material for solar cell according to claim 1, wherein a density of the ethylene/α-olefin copolymer, which is measured on the basis of ASTM D1505, is in a range of 0.865 g/cm$^3$ to 0.884 g/cm$^3$.

7. The encapsulating material for solar cell according to claim 1, wherein MFR of the ethylene/α-olefin copolymer, which is based on ASTM D1238 and measured under conditions of 190° C. and a load of 2.16 kg, is in a range of 5 g/10 minutes to 50 g/10 minutes.

8. The encapsulating material for solar cell according to claim 1, wherein a content of an aluminum element in the ethylene/α-olefin copolymer is in a range of 10 ppm to 500 ppm with respect to the entire ethylene/α-olefin copolymer.

9. The encapsulating material for solar cell according to claim 1, wherein the ethylene/polar monomer copolymer is at least one selected from a group consisting of ethylene/unsaturated carboxylic acid copolymers, ethylene/unsaturated carboxylic anhydride copolymers, ethylene/unsaturated carboxylic acid ester copolymers, ethylene/unsaturated carboxylic acid ester/unsaturated carboxylic acid copolymers, ethylene/unsaturated glycidyl ester copolymers, ethylene/unsaturated glycidyl ether copolymers, ethylene/unsaturated glycidyl ester/unsaturated carboxylic acid ester copolymers, ethylene/unsaturated glycidyl ether/unsaturated carboxylic acid ester copolymers, and ethylene/vinyl ester copolymers.

10. The encapsulating material for solar cell according to claim 9, wherein the ethylene/polar monomer copolymer is an ethylene/vinyl acetate copolymer.

11. The encapsulating material for solar cell according to claim 10, wherein a content of vinyl acetate in the ethylene/vinyl acetate copolymer is in a range of 15 weight % to 47 weight % with respect to the entire ethylene/vinyl acetate copolymer.

12. The encapsulating material for solar cell according to claim 1, wherein MFR of the ethylene/polar monomer copolymer, which is based on ASTM D1238 and measured under conditions of 190° C. and a load of 2.16 kg, is in a range of 5 g/10 minutes to 50 g/10 minutes.

13. The encapsulating material for solar cell according to claim 1, wherein the resin composition contains a silane coupling agent, and a content of the silane coupling agent is in a range of 0.1 parts by weight to 2.0 parts by weight with respect to 100 parts by weight of the crosslinkable resin.

14. The encapsulating material for solar cell according to claim 1, wherein the resin composition contains an organic peroxide, and a content of the organic peroxide is in a range of 0.1 parts by weight to 1.2 parts by weight with respect to 100 parts by weight of the crosslinkable resin.

15. The encapsulating material for solar cell according to claim 1, wherein the resin composition contains at least one selected from a group consisting of an ultraviolet absorber, a light stabilizer, and a heat-resistant stabilizer, and a content of at least one selected from the group consisting of the ultraviolet absorber, the light stabilizer, and the heat-resistant stabilizer is in a range of 0.005 parts by weight to 5 parts by weight with respect to 100 parts by weight of the crosslinkable resin.

16. The encapsulating material for solar cell according to claim 1, wherein the resin composition contains a crosslinking aid, and a content of the crosslinking aid is in a range of 0.05 parts by weight to 5 parts by weight with respect to 100 parts by weight of the crosslinkable resin.

17. The encapsulating material for solar cell according to claim 1, wherein the encapsulating material for solar cell has a sheet shape.

18. A solar cell module comprising:

a transparent surface protective member;
a back surface protective member;
a solar cell element; and
an encapsulating layer which is formed by crosslinking the encapsulating material for solar cell according to claim 1 and encapsulates the solar cell element between the transparent surface protective member and the back surface protective member.

19. An encapsulating film which is made of a crosslinked resin composition containing a crosslinkable resin, encapsulates a solar cell element, and satisfies the following A) and B):

A) when the encapsulating film is immersed in acetone at 23° C. for one hour, an acetone-absorbing ratio is in a range of 3.5 weight % to 12.0 weight % with respect to a weight of the encapsulating film, and B) a volume resistivity of the encapsulating film, which is based on JIS K6911 and measured at a temperature of 100° C. with an applied voltage of 500 V, is in a range of $1.0 \times 10^{13}$ Ω·cm to $1.0 \times 10^{18}$ Ω·cm, wherein the crosslinkable resin contains an ethylene/α-olefin copolymer and an ethylene/polar monomer copolymer, a content of the ethylene/α-olefin copolymer in the crosslinkable resin is in a range of 50 parts by weight to 99 parts by weight with respect to 100 parts by weight of the crosslinkable resin, and a content of the ethylene/polar monomer copolymer in the crosslinkable resin is in a range of 1 part by weight to 50 parts by weight with respect to 100 parts by weight of the crosslinkable resin.

20. The encapsulating film according to claim 19, further satisfying the following C):

C) a shore A hardness of the encapsulating film, which is measured on the basis of ASTM D2240, is in a range of 50 to 85.

21. The encapsulating film according to claim 19, further satisfying the following D):

D) when the encapsulating film is immersed in t-butyl alcohol at 30° C. for one hour, a t-butyl alcohol-absorbing ratio is in a range of 2.5 weight % to 6.0 weight % with respect to the weight of the encapsulating film.

* * * * *